(12) United States Patent
Osada et al.

(10) Patent No.: US 10,338,835 B2
(45) Date of Patent: Jul. 2, 2019

(54) MEMORY DEVICE

(71) Applicant: TOSHIBA MEMORY CORPORATION, Minato-ku, Tokyo (JP)

(72) Inventors: Yoshiaki Osada, Kawasaki Kanagawa (JP); Katsuhiko Hoya, Yokohama Kanagawa (JP); Yorinobu Fujino, Hachioji Tokyo (JP); Kosuke Hatsuda, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 2 days.

(21) Appl. No.: 15/457,518

(22) Filed: Mar. 13, 2017

(65) Prior Publication Data

US 2018/0074737 A1 Mar. 15, 2018

Related U.S. Application Data

(60) Provisional application No. 62/394,175, filed on Sep. 13, 2016.

(51) Int. Cl.

| G06F 11/08 | (2006.01) |
|---|---|
| G06F 3/06 | (2006.01) |
| G06F 11/10 | (2006.01) |
| G11C 11/16 | (2006.01) |
| G11C 29/52 | (2006.01) |
| G11C 29/00 | (2006.01) |

(52) U.S. Cl.
CPC .......... *G06F 3/0625* (2013.01); *G06F 3/0659* (2013.01); *G06F 3/0679* (2013.01); *G06F 11/1048* (2013.01); *G06F 11/1068* (2013.01); *G11C 11/1673* (2013.01); *G11C 11/1675* (2013.01); *G11C 29/52* (2013.01); *G11C 29/781* (2013.01)

(58) Field of Classification Search
None
See application file for complete search history.

(56) References Cited

U.S. PATENT DOCUMENTS

| 9,112,536 B2 | 8/2015 | Alam et al. | |
|---|---|---|---|
| 9,202,562 B2 * | 12/2015 | Huang | G11C 13/004 |
| 2006/0277367 A1 | 12/2006 | Faber | |
| 2009/0249167 A1 | 10/2009 | Nakaigawa | |
| 2009/0319722 A1 | 12/2009 | Murin et al. | |
| 2010/0162080 A1 | 6/2010 | Kinoshita | |

(Continued)

FOREIGN PATENT DOCUMENTS

| JP | 10027496 A | 1/1998 |
|---|---|---|
| JP | 2009245528 A | 10/2009 |

(Continued)

*Primary Examiner* — Mujtaba M Chaudry
(74) *Attorney, Agent, or Firm* — Holtz, Holtz & Volek PC

(57) ABSTRACT

According to one embodiment, a memory device includes a memory cell; a first circuit that performs a first read on the memory cell, writes first data in the memory cell on which the first read has been performed, performs a second read on the memory cell in which the first data has been written, determines data from a result of the first read based on a result of the second read, and writes back the determined data into the memory cell; and an error correcting circuit that performs error correction on the determined data.

16 Claims, 24 Drawing Sheets

(56) References Cited

U.S. PATENT DOCUMENTS

| | | | |
|---|---|---|---|
| 2011/0087950 A1* | 4/2011 | Yu | G06F 11/1072 |
| | | | 714/773 |
| 2012/0311396 A1* | 12/2012 | Andre | G06F 11/1048 |
| | | | 714/752 |
| 2013/0279243 A1* | 10/2013 | Huang | G11C 13/004 |
| | | | 365/158 |
| 2014/0139940 A1* | 5/2014 | Ong | G11B 5/012 |
| | | | 360/39 |
| 2014/0281128 A1* | 9/2014 | Krishnan | G06F 12/0246 |
| | | | 711/103 |
| 2014/0372792 A1 | 12/2014 | Slaughter et al. | |
| 2015/0355967 A1 | 12/2015 | Alam et al. | |
| 2016/0139986 A1 | 5/2016 | Chen | |
| 2016/0315639 A1* | 10/2016 | Shang | G06F 9/38 |

FOREIGN PATENT DOCUMENTS

| | | | |
|---|---|---|---|
| JP | 2010146389 A | 7/2010 | |
| JP | 2011525680 A | 9/2011 | |

* cited by examiner

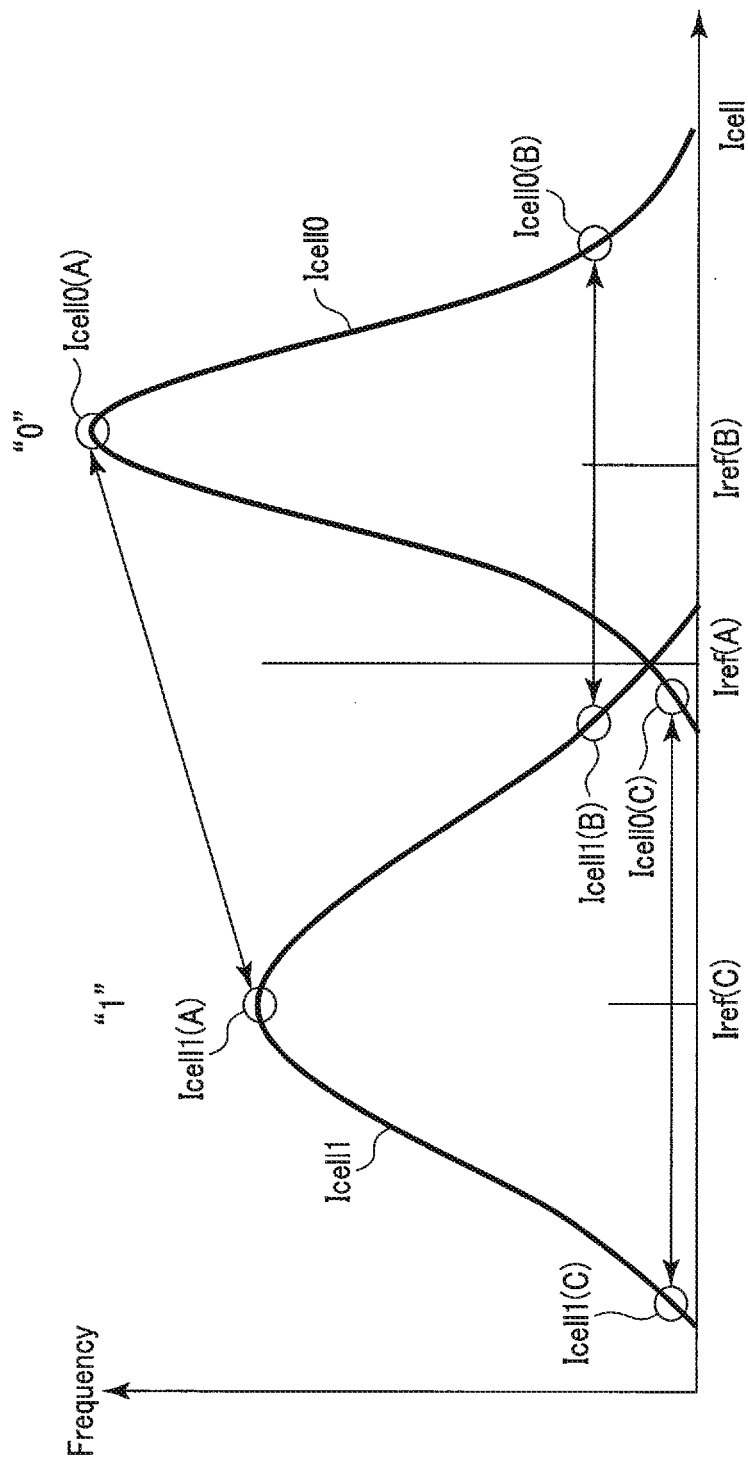
F I G. 5

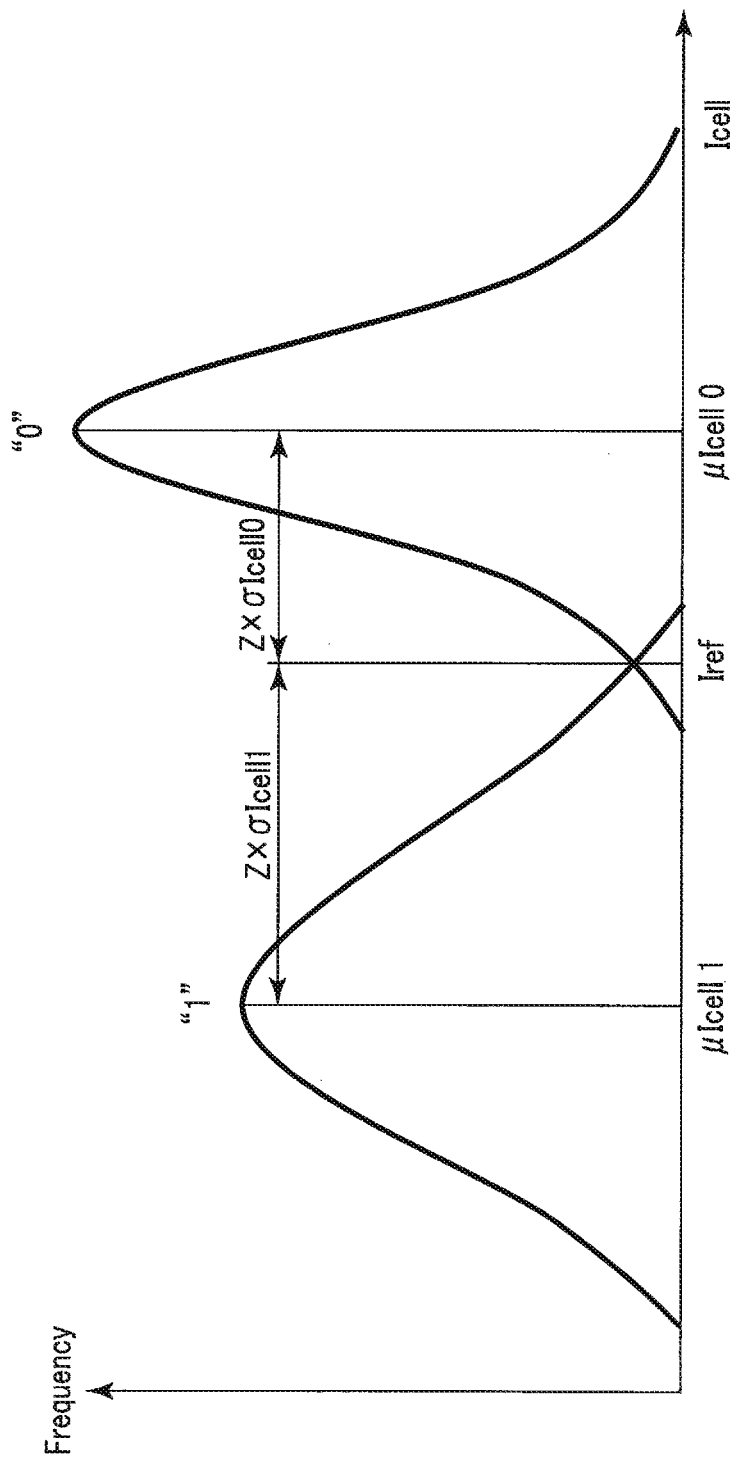
F I G. 7

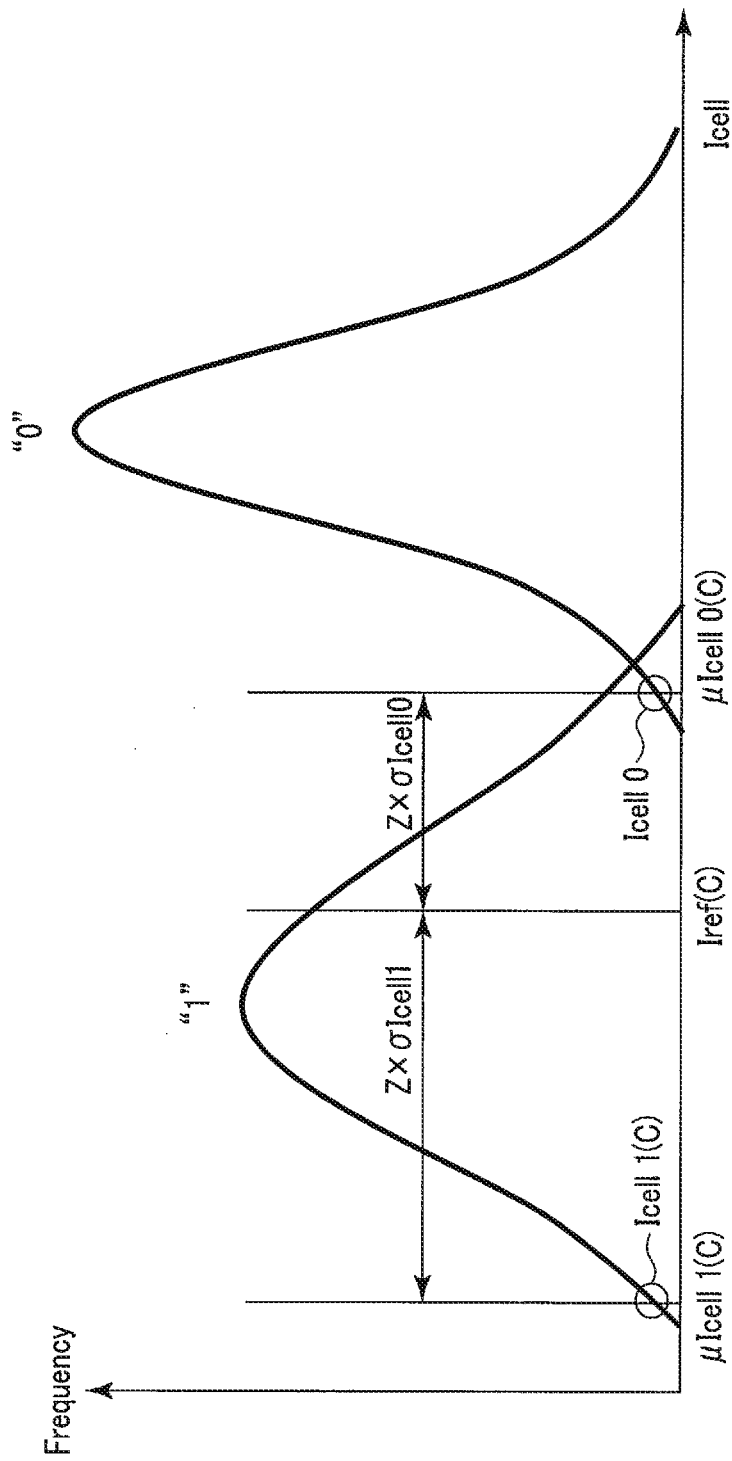
F I G. 8

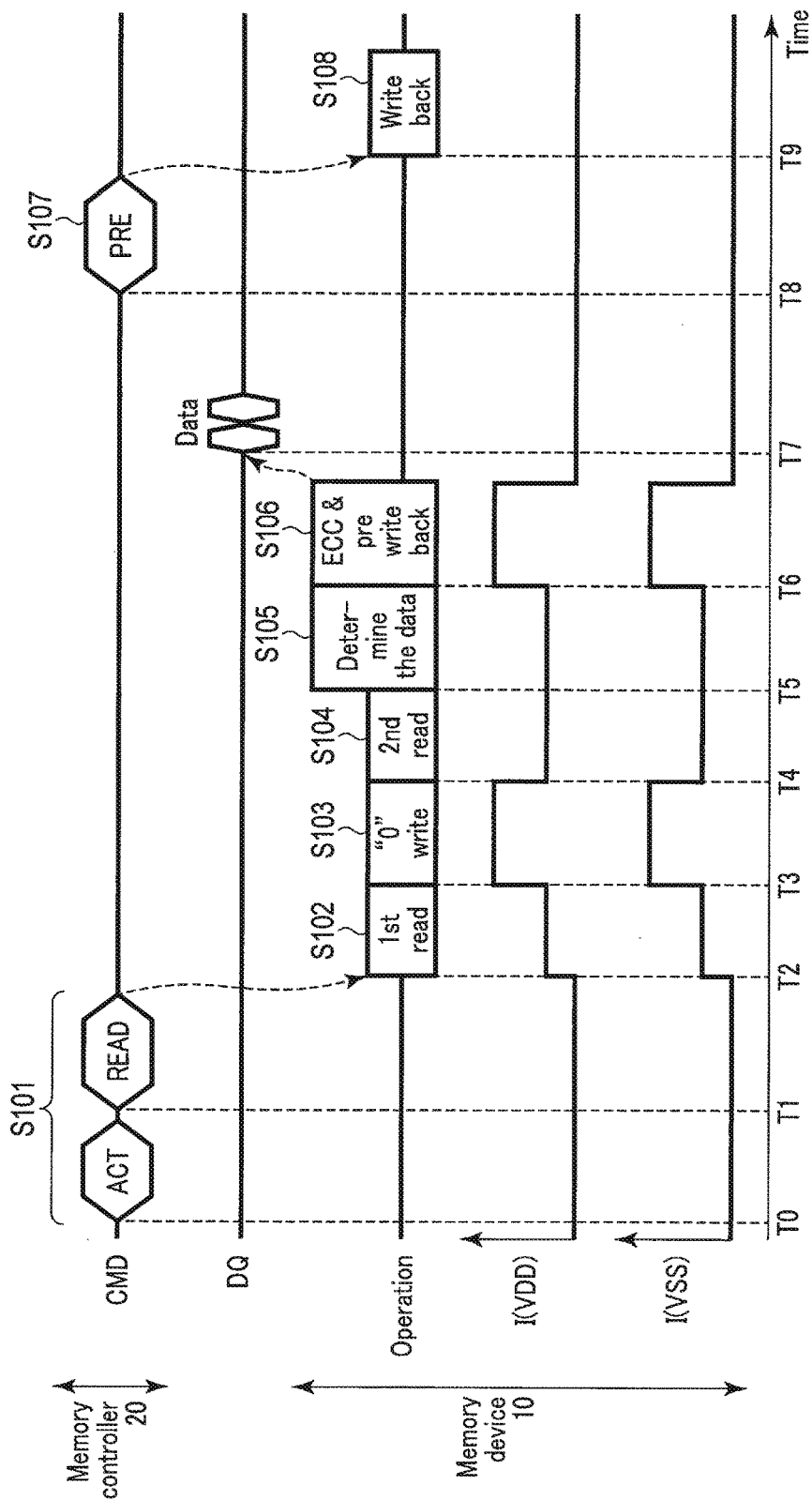
F I G. 9

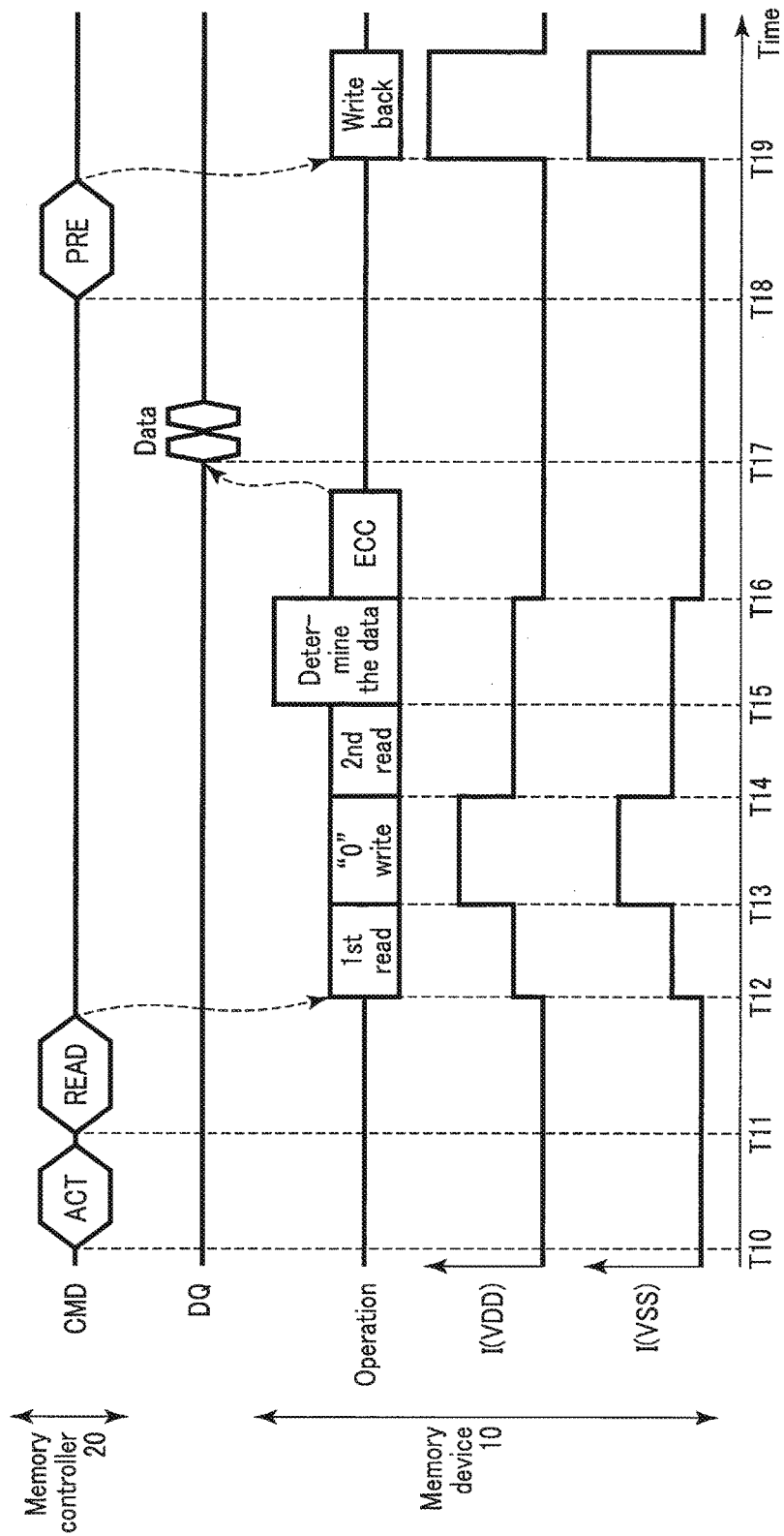
F I G. 10

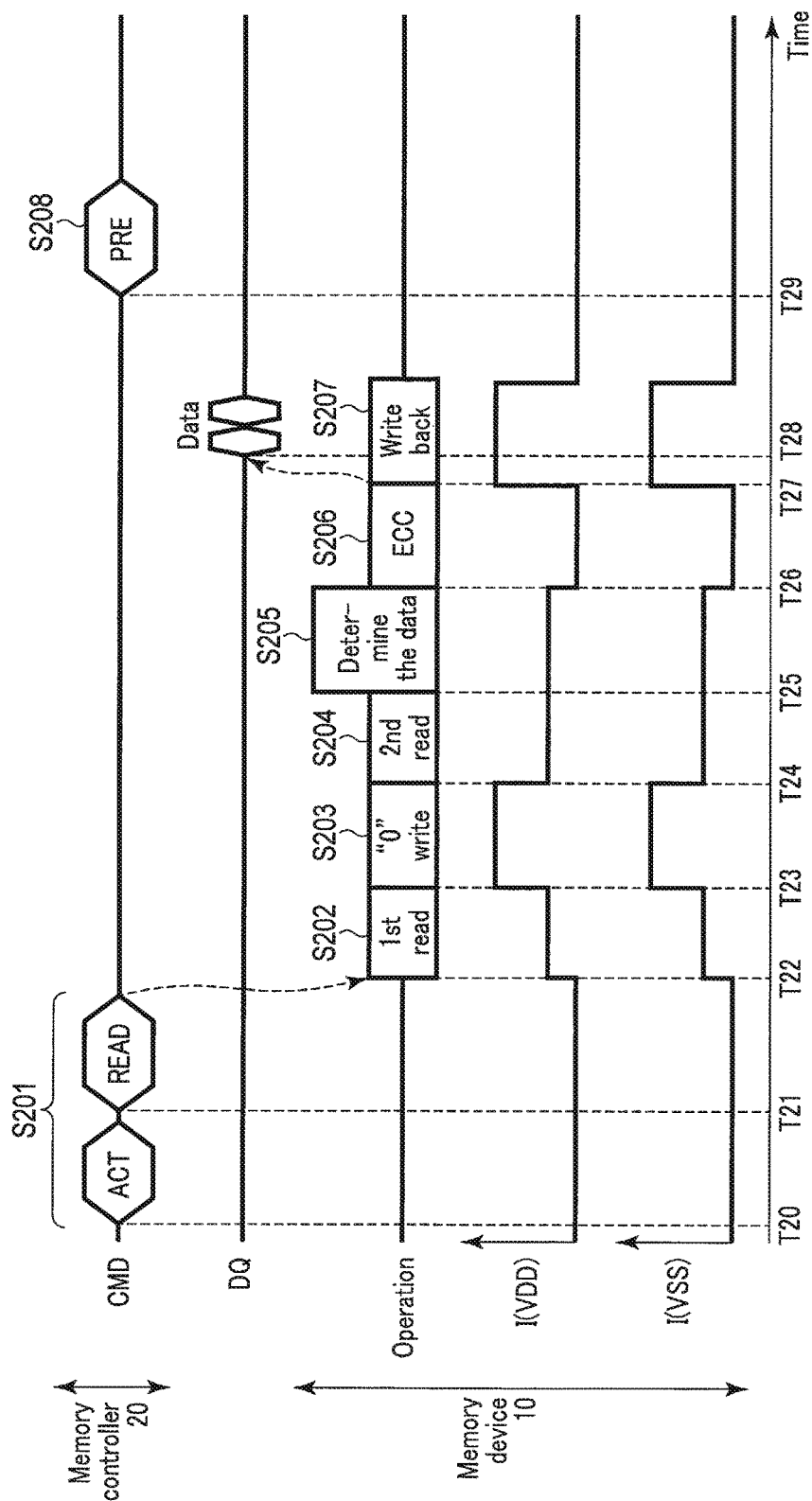
F I G. 12

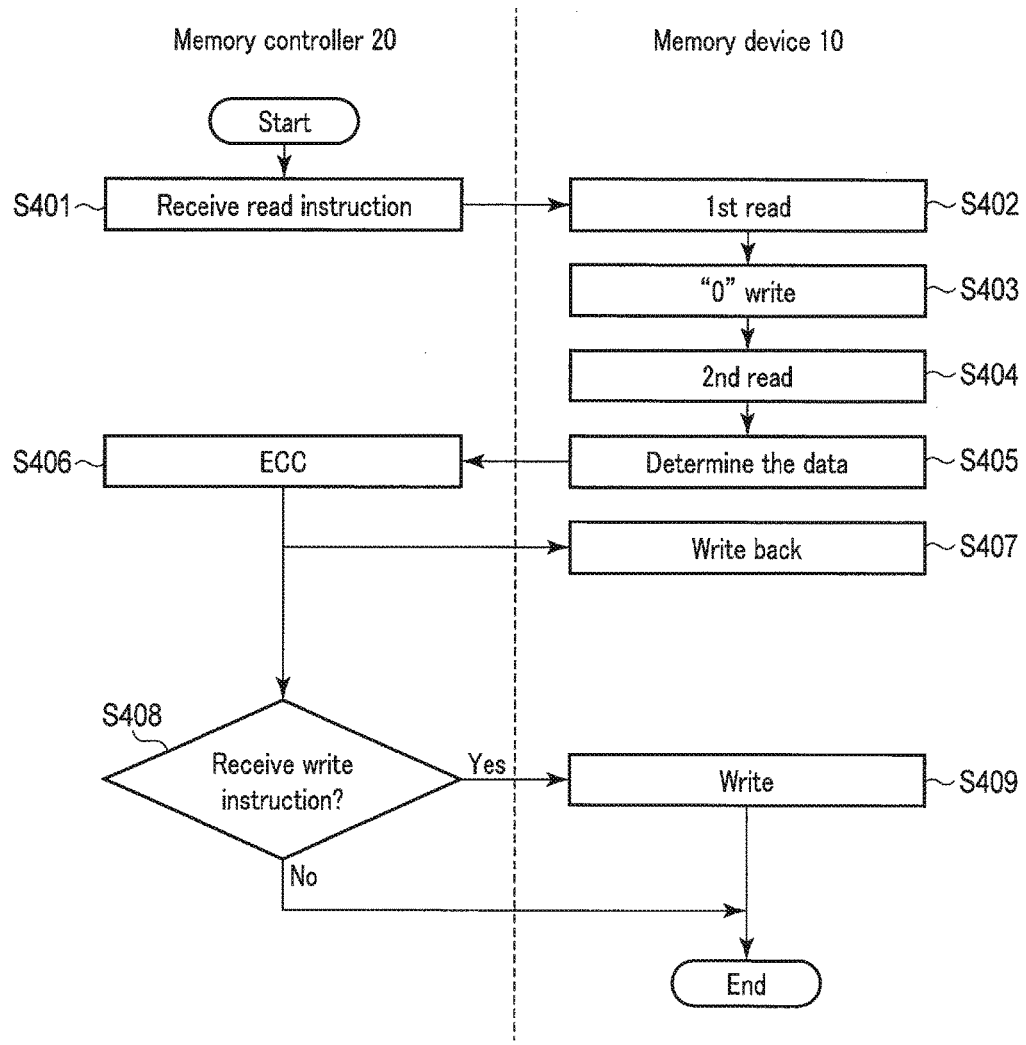
F I G. 17

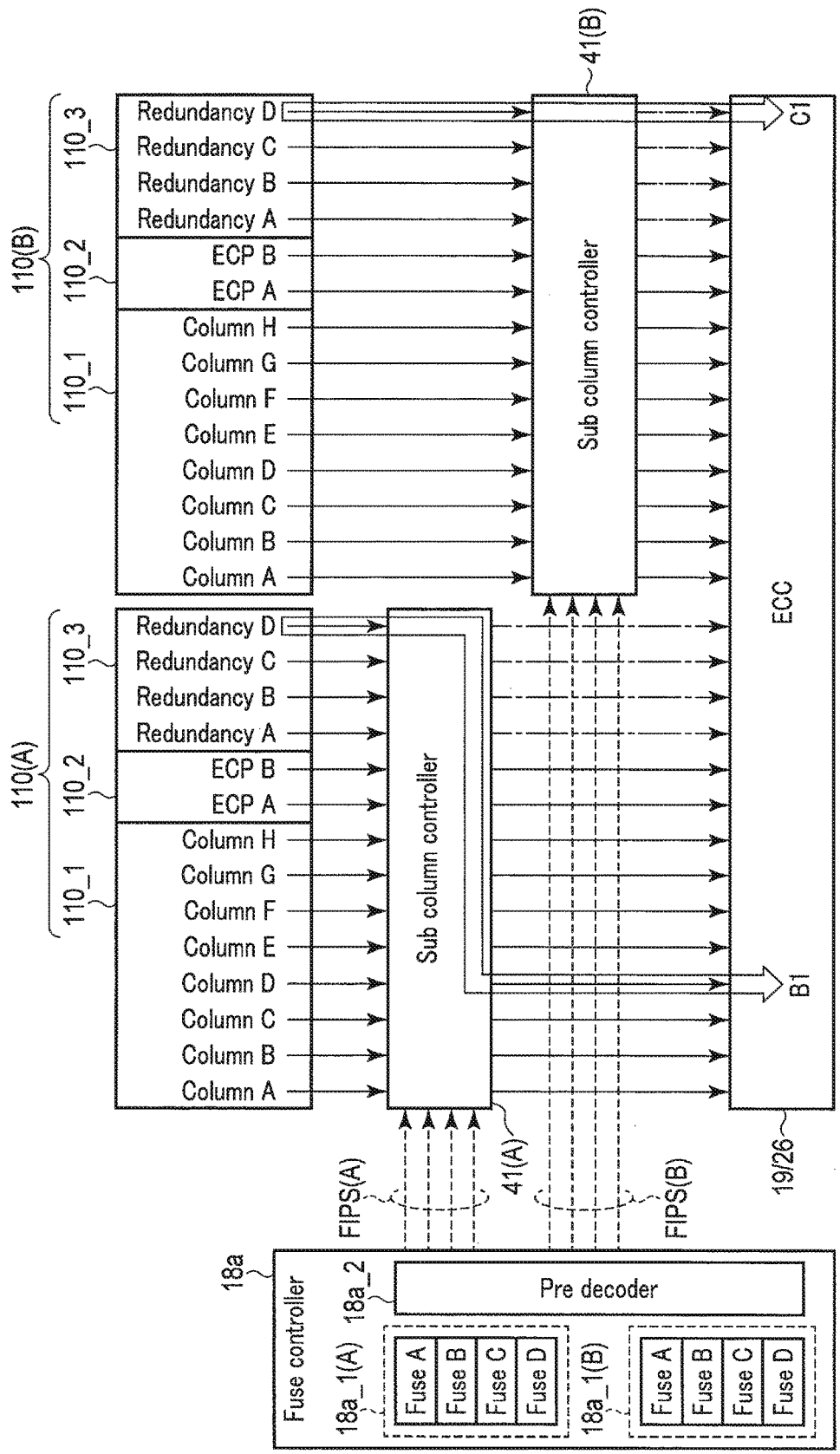
F I G. 21

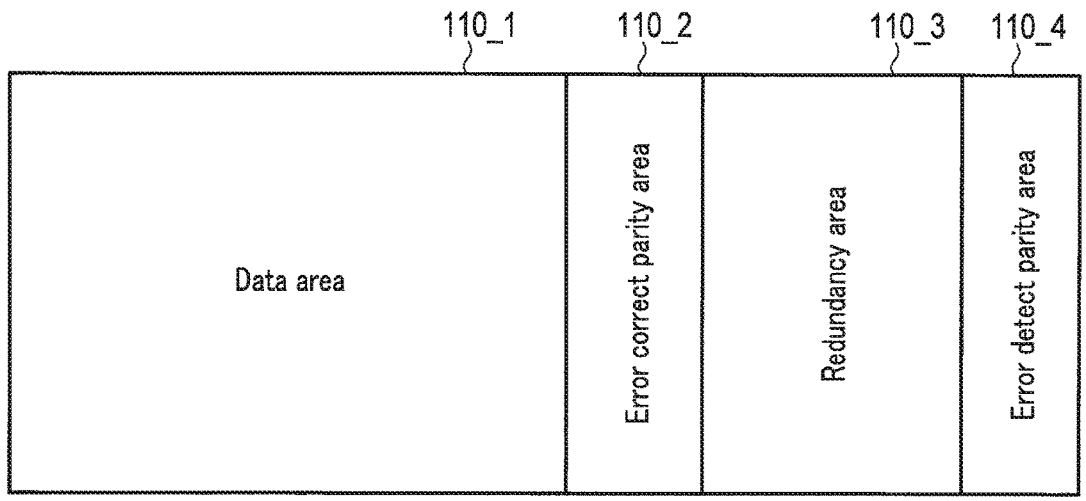
F I G. 22
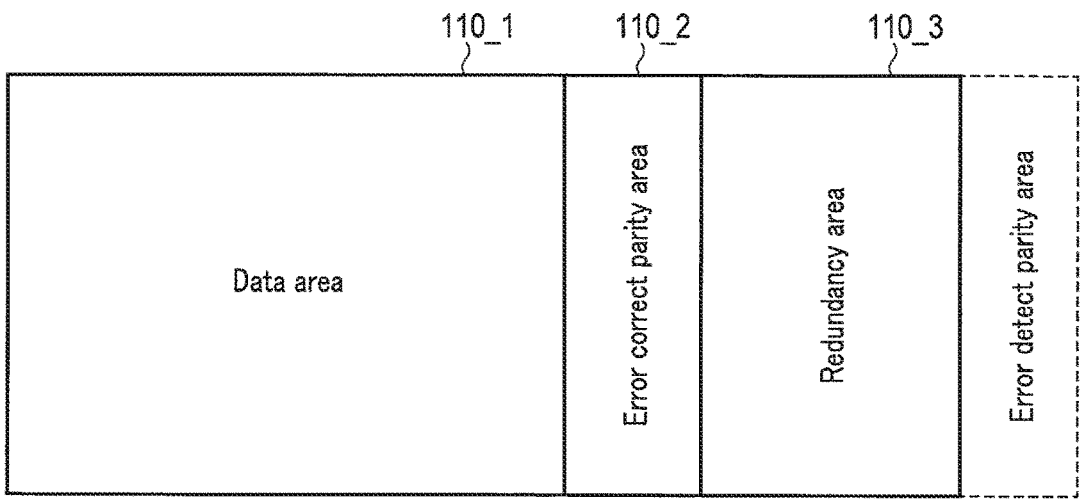
F I G. 23

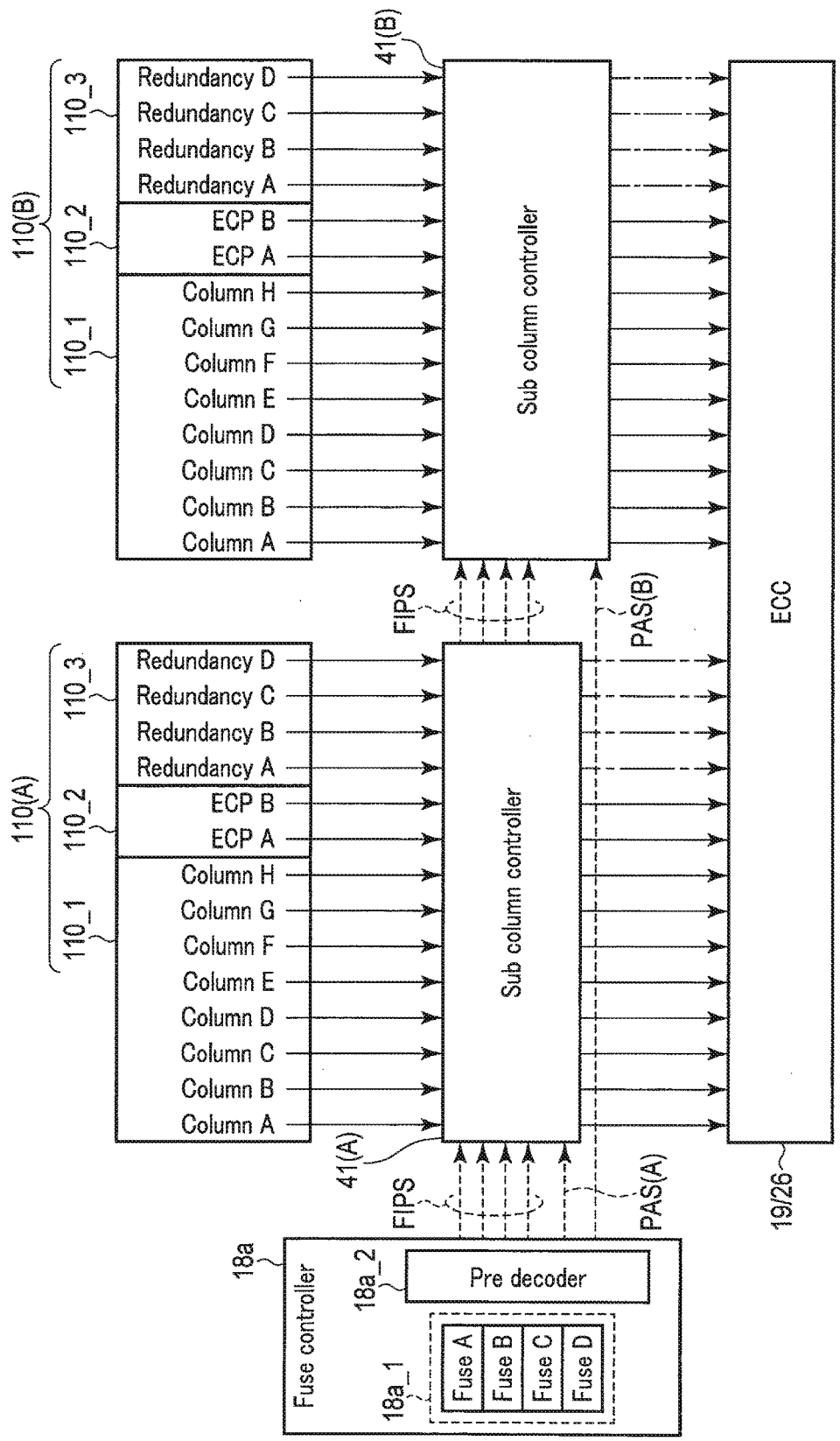
F I G. 24

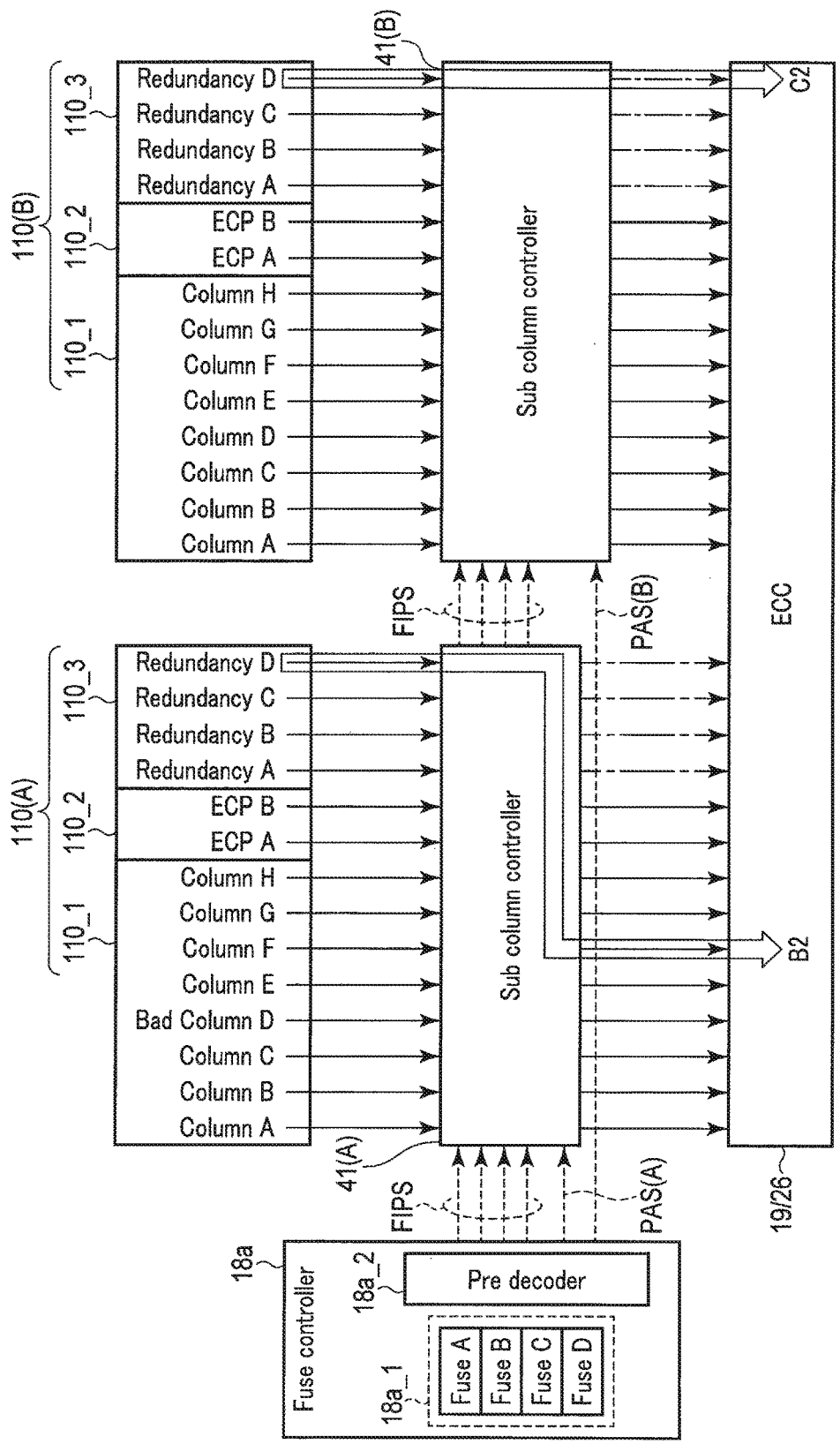
F I G. 25

MEMORY DEVICE

CROSS-REFERENCE TO RELATED APPLICATIONS

This application claims the benefit of U.S. Provisional Application No. 62/394,175, filed Sep. 13, 2016, the entire contents of which are incorporated herein by reference.

FIELD

Embodiments described herein relate generally to a memory device.

BACKGROUND

A magnetoresistive random access memory (MRAM) is a memory device employing, as a memory cell for storing information, a magnetic element having a magnetoresistive effect. The MRAM is receiving attention as a next-generation memory device characterized by its high-speed operation, large storage capacity, and non-volatility. Research and development is advancing to use the MRAM as a replacement for a volatile memory, such as a dynamic random access memory (DRAM) or a static random access memory (SRAM). In order to lower development costs and enable smooth replacement, it is desirable to operate the MRAM on the same specifications as the DRAM and SRAM.

BRIEF DESCRIPTION OF THE DRAWINGS

FIG. 5 is a graph showing cell current distribution of the memory system according to the first embodiment.

FIG. 7 is a graph showing cell current distribution of the memory system according to the first embodiment.

FIG. 8 is a graph showing cell current distribution of the memory system according to the first embodiment.

FIG. 9 is a timing chart relating to an example of the read operation of the memory system according to the first embodiment.

FIG. 10 is a timing chart relating to an example of the read operation of a memory system according to a comparison example of the first embodiment.

FIG. 12 is a timing chart relating to an example of the read operation of the memory system according to the second embodiment.

FIG. 17 is a flowchart of a read operation of a memory system according to a fourth embodiment.

FIG. 21 is a block diagram showing a configuration of a memory array and its periphery of the memory system according to the fifth embodiment.

FIG. 22 is a block diagram showing a configuration of a memory array and its periphery of a memory system according to a comparative example of the fifth embodiment.

FIG. 23 is a block diagram showing the memory array of the memory system according to the fifth embodiment.

FIG. 24 is a block diagram showing a configuration of a memory array and its periphery of a memory system according to a sixth embodiment.

FIG. 25 is a block diagram showing a configuration of the memory array and its periphery of the memory system according to the sixth embodiment.

DETAILED DESCRIPTION

In general, according to one embodiment, a memory device includes: a memory cell; a first circuit that performs a first read on the memory cell, writes first data in the memory cell on which the first read has been performed, performs a second read on the memory cell in which the first data has been written, determines data from a result of the first read based on a result of the second read, and writes back the determined data into the memory cell; and an error correcting circuit that performs error correction on the determined data.

Hereinafter, embodiments will be described with reference to the drawings. In the description below, structural elements having approximately the same function and configuration will be assigned with the same reference symbol, and a repetitive description will be given only where necessary. Each of the embodiments described below merely indicates an exemplary apparatus or method for implementing the technical idea of the embodiment. The element materials, shapes, structures, arrangements, etc. of the technical ideas of the embodiments are not limited to the ones described below. The technical ideals of the embodiments may be varied within the range of the claims.

Each of the function blocks can be implemented in the form of hardware, computer software, or a combination thereof. In order to clarify that each block may be any of them, the block will be described below in terms of their functions in general. Whether the functions are implemented as hardware or software depend on specific embodiments or design restrictions imposed on the entire system. Those skilled in the art can implement the functions in various ways for respective specific embodiments, and how to implement the functions is within the range of the present invention.

Described in each embodiment below is the case where an MRAM is applied to a memory array.

Figure 1:
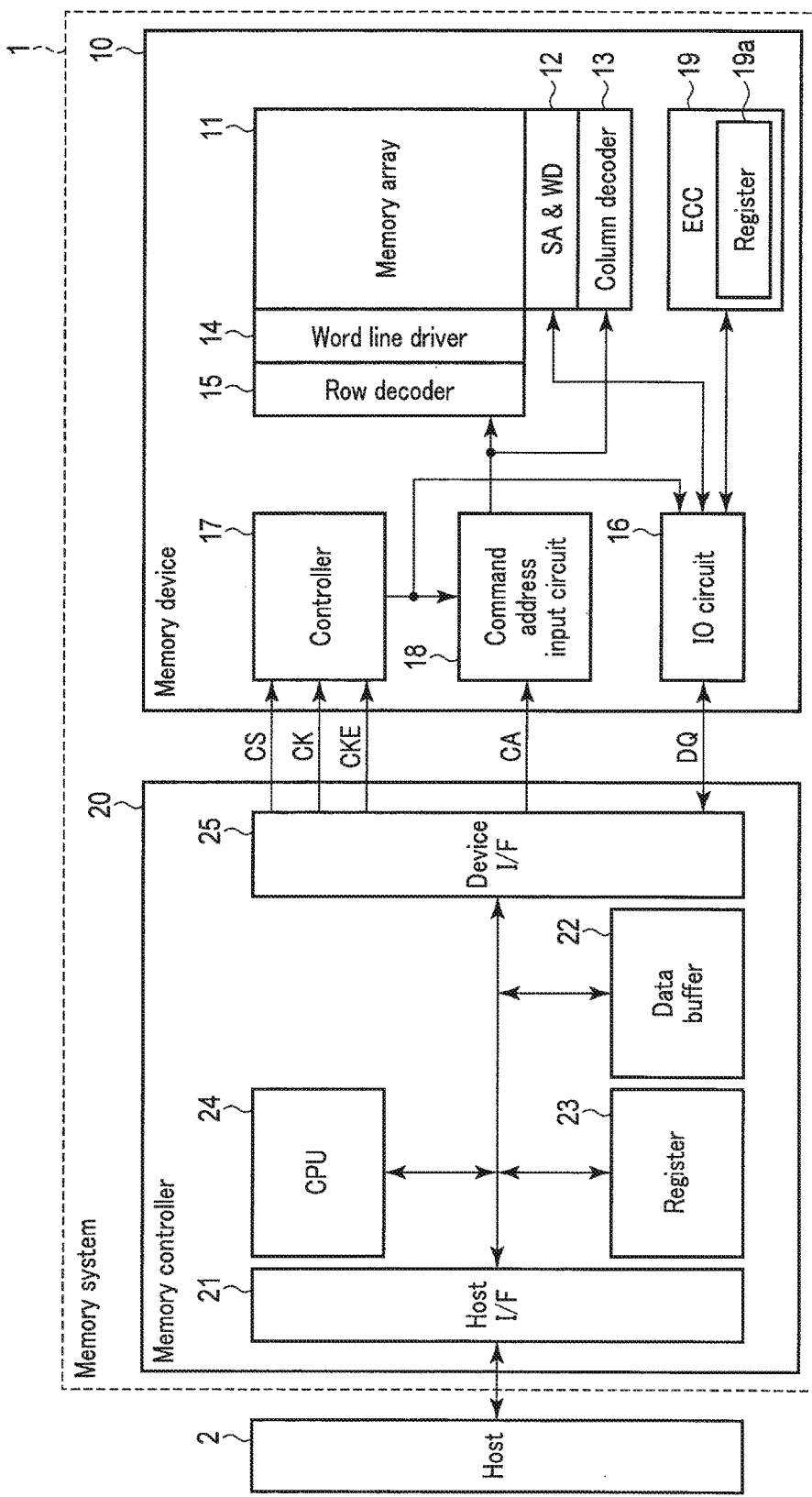
FIG. 1 is a block diagram showing a configuration of a memory system according to a first embodiment.

<1> First Embodiment
<1-1> Configuration
<1-1-1> Configuration of Memory System A basic configuration of a memory system 1 according to the first embodiment will be schematically described with reference to FIG. 1. The memory system 1 includes a memory device 10 and a memory controller 20.

<1-1-2> Configuration of Memory Controller

Upon receipt of a command from a host (external device) 2, such as a personal computer, the memory controller 20 reads data from the memory device 10 or writes data in the memory device 10.

The memory controller 20 includes a host interface (I/F) 21, a data buffer 22, a register 23, a central processing unit (CPU) 24, and a device interface (I/F) 25.

The host interface 21 is connected to the host 2. Data is transmitted and received between the host 2 and the memory system 1 via the host interface 21.

The data buffer 22 is connected to the host interface 21. The data buffer 22 receives, via the host interface 21, data transmitted from the host 2 to the memory system 1, and temporarily stores the data. The data buffer 22 also temporarily stores data to be transmitted from the memory system 1 to the host 2 via the host interface 21. The data buffer 22 may be either a volatile memory or a nonvolatile memory.

The register 23 is, for example, a volatile memory, and stores information on setting executed by the CPU 24, commands, and statuses, etc. The register 23 may be either a volatile memory or a nonvolatile memory.

The CPU 24 controls the overall operation of the memory system 1. The CPU 24 performs predetermined processing for the memory device 10 in accordance with a command received from the host 2, for example.

The device interface 25 transmits and receives various signals between the memory controller 20 and the memory device 10.

<1-1-3> Configuration of Memory Device

The memory device 10 according to the first embodiment includes a memory array 11, a sense amplifier/write driver 12, a column decoder 13, a word line driver 14, a row decoder 15, an IO circuit 16, a controller 17, a command address input circuit 18, and an error correcting code (ECC) circuit 19.

The command address input circuit 18 receives various external control signals, such as a chip select signal CS, a clock signal CK, a clock enable signal CKE, and a command address signal CA, from the memory controller 20. The command address input circuit 18 transfers the command address signal CA to the controller 17.

The controller 17 distinguishes between a command and an address. The controller 17 controls the memory device 10.

The ECC circuit 19 receives write data received from the memory controller 20 via a data line DQ and the IO circuit 16. The ECC circuit 19 adds an error correcting code to the write data. The ECC circuit 19 supplies the write data including the error correcting code to the sense amplifier/write driver 12 via the IO circuit 16, for example.

The ECC circuit 19 also receives data supplied from the memory device 11 via the IO circuit 16. The data is data that is stored in a memory cell group of the memory array 11. The memory cell group is a set of memory cells MC, and corresponds to a read unit at the time of a read operation. The ECC circuit 19 determines whether the received data contains an error. When the ECC circuit 19 determines that the received data contains an error, the ECC circuit 19 performs error correction processing on the received data by using the error correcting code. The ECC circuit 19 supplies the error-corrected data to the memory controller 20 via the IO circuit 16, for example.

The ECC circuit 19 includes a register 19a. The register 19a is, for example, a volatile memory, and stores error-corrected data. The register 19a may be either a volatile memory or a nonvolatile memory.

The memory array 11 is an MRAM and includes a two-dimensional matrix of a plurality of memory cells MC. Each memory cell MC includes a magnetic tunnel junction (MTJ) element 30 (not shown) and a selection transistor 31 (not shown). The MTJ element 30 is a magnetic tunnel junction element that stores data by changes in a resistance condition, and allows data to be rewritten by a current. The selection transistor 31 is provided to correspond to each MTJ element 30, and is brought into conduction when a current is applied to the corresponding MTJ element 30.

Word lines WL extend in the row direction, and bit lines BL extend in the column direction. The word lines WL are arranged to intersect the bit lines BL. Two adjacent bit lines BL form a pair, and a memory cell MC is provided at each intersection between a word line WL and a bit line pair (which will be referred to as a bit line BL and a source line SL for descriptive purposes in the present embodiment). The MTJ element 30 and the selection transistor 31 of each memory cell MC are connected in series between the bit line BL and the source line SL (i.e., between the bit line pair). The gate of the selection transistor 31 is connected to the word line WL.

The word line driver 14 is provided along at least a side of the memory array 11. The word line driver 14 is configured to apply a voltage to the word line WL when reading data or writing data.

The row decoder 15 decodes the address of the command address signal CA supplied from the command/address input circuit 18. Specifically, the row decoder 15 supplies the decoded row address to the word line driver 14. The word line driver 14 can thereby apply a voltage to a selected word line WL.

The column decoder 13 decodes the address of the command address signal CA supplied from the command/address input circuit 18. The column decoder 13 supplies the decoded column address to the sense amplifier/write driver 12.

The sense amplifier/write driver 12 includes a sense amplifier and a write driver. The sense amplifier/write driver 12 is provided along at least a side of the memory array 11. The sense amplifier is connected to the bit lines BL via a global bit line GB, and detects a current flowing in the memory cell MC connected to the selected word line WL to read data stored in the memory cell MC. The write driver is connected to the bit lines BL via the global bit line GBL, or to the source lines SL via a global source line GSL. The write driver applies a current to the selection memory cell MC connected to the selected word line WL when writing data in the selection memory cell MC.

The sense amplifier/write driver 12 includes a page buffer not shown in the figure. The page buffer is, for example, a volatile memory, and stores data read by the sense amplifier or write data transferred via the IO circuit 16.

Data exchange between the sense amplifier/write driver 12 and the data line DQ is performed via the IO circuit 16.

<1-1-4> Memory Array

Figure 2:
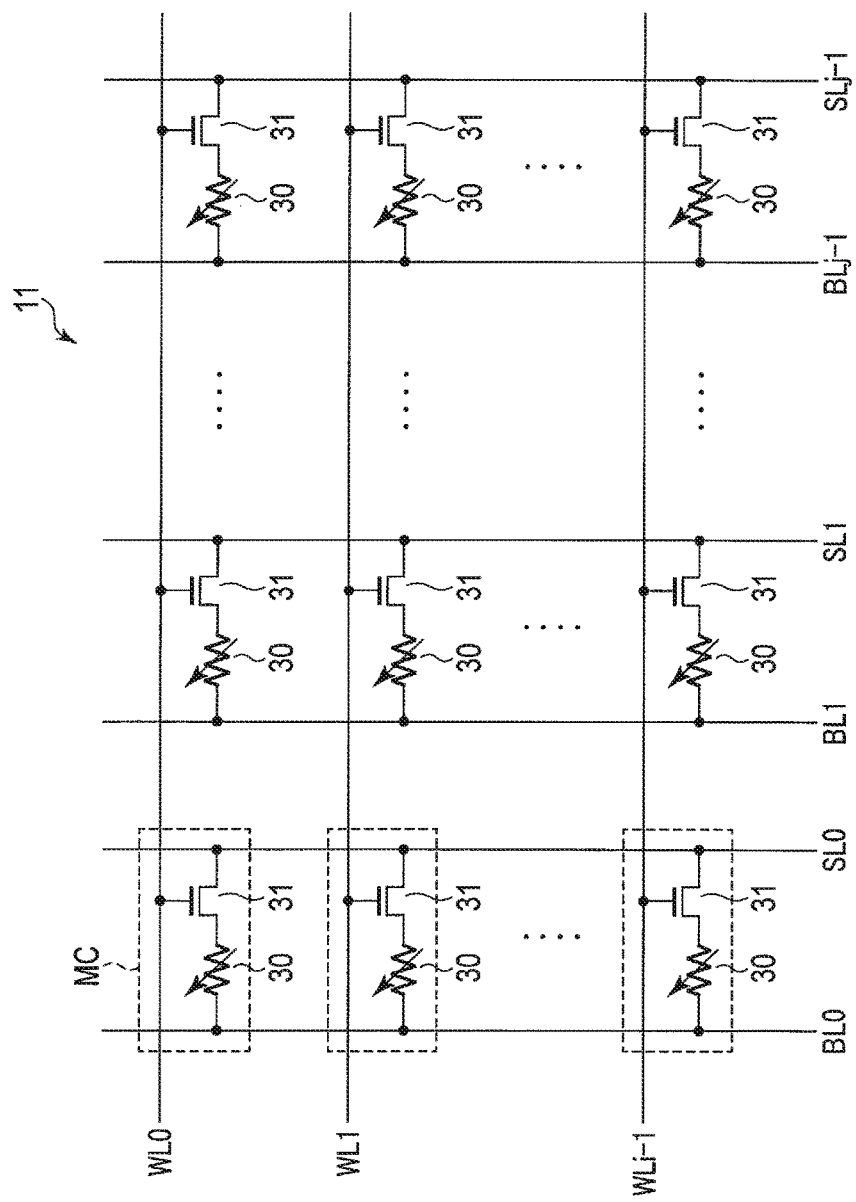
FIG. 2 is a circuit diagram showing a configuration of a memory array of the memory system according to the first embodiment.

Next, a specific configuration of the memory array according to the embodiment will be described with reference to FIG. 2. As described above, the memory array 11 includes a matrix of a plurality of memory cells MC.

Specifically, the memory array 11 includes a plurality of word lines WL0 to WLi−1 (i: an integer not less than 2), a plurality of bit lines BL0 to BLj−1, and a plurality of source lines SL0 to SLj−1 (j: an integer not less than 2).

Each memory cell MC includes an MTJ element 30 and a selection transistor 31. The selection transistor 31 is formed of an N-channel metal oxide silicon field effect transistor (MOSFET), for example.

One end of the MTJ element 30 is connected to a bit line BL, and the other end thereof is connected to the drain of the selection transistor 31. The gate of the selection transistor 31 is connected to a word line WL, and the source thereof is connected to a source line SL.

<1-1-5> Memory Cell

Next, the memory cell according to the embodiment will be schematically described with reference to FIG. 3.

Figure 3:
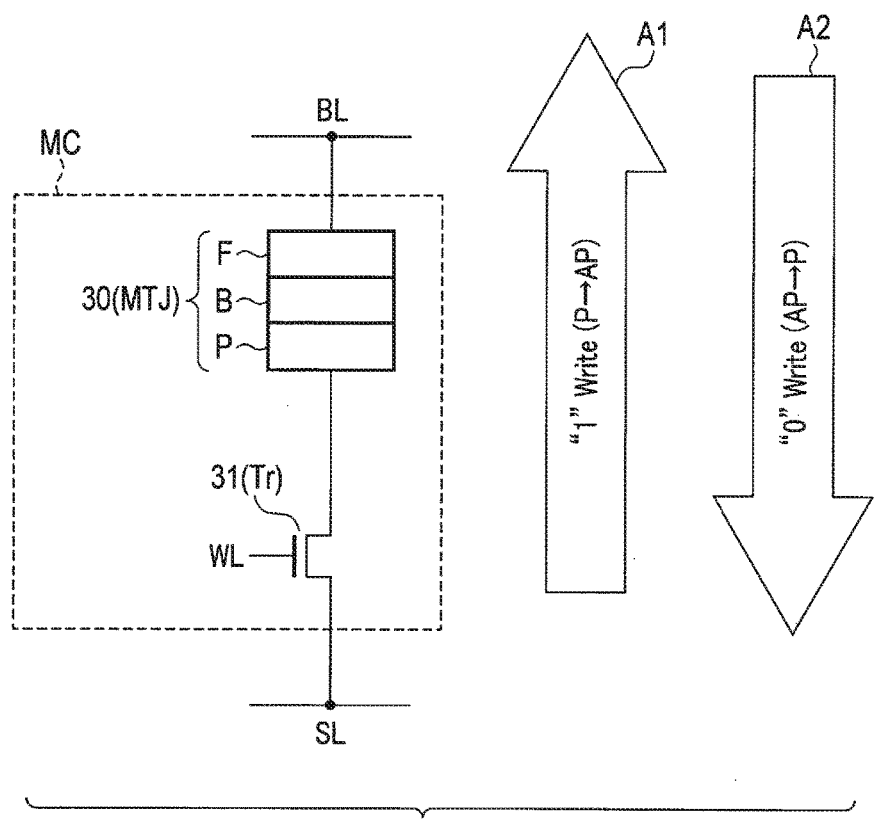
FIG. 3 shows a basic configuration of the memory cell of the memory system according to the first embodiment.

As shown in FIG. 3, the MTJ element 30 utilizing a tunneling magnetoresistive (TMR) effect has a laminated structure of two ferromagnetic layers F and P and a non-magnetic layer (tunnel insulation film) B interposed therebetween, and stores digital data by utilizing changes in the magnetic resistance caused by a spin-polarized tunneling effect. The MTJ element 30 can go into a low-resistance state or a high-resistance state in accordance with a magnetic orientation of the two ferromagnetic layers F and P. For example, if the low-resistance state is defined as data "0", and the high-resistance state is defined as data "1", 1-bit data can be stored in the MTJ element 30. The low-resistance state may, of course, be defined as data "1", and the high-resistance state may be defined as data "0".

The MTJ element 30 is formed by, for example, sequentially stacking a fixing layer (pin layer) P, a tunnel barrier layer B, and a recording layer (free layer) F. The pin layer P is a layer of which the magnetic orientation is fixed, while the free layer F is a layer of which the magnetic orientation is variable and which stores data by utilizing the magnetic orientation. The pin layer P and the free layer F are made of a ferromagnetic material, and the tunnel barrier layer B is made of an insulating film.

Specifically, for the free layer F, cobalt iron boron (CoFeB) or iron boride (FeB) may be used, for example. For the pin layer P, cobalt platinum (CoPt), cobalt nickel (CoNi), or cobalt palladium (CoPd) may be used, for example. The tunnel barrier layer B is made of a non-magnetic material, such as a non-magnetic metal, non-magnetic semiconductor or insulator. For the tunnel barrier layer B, magnesium oxide (MgO) or aluminum oxide ($Al_2O_3$) may be used, for example.

When a current flows in the direction of arrow A1 in a write operation, the magnetic orientation of the free layer F becomes anti-parallel (AP state) with respect to the magnetic orientation of the pin layer P. As a result, the MTJ element 30 goes into the high-resistance state (data "1"). Such a write operation may be called a "1" write operation. When a current flows in the direction of arrow A2 in a write operation, the magnetic orientation of the free layer F becomes parallel (P state) with respect to the magnetic orientation of the pin layer P. As a result, the MTJ element 30 goes into the low-resistance state (data "0"). Such a write operation may be called a "0" write operation. In this manner, different data can be written in the MTJ element depending on the direction in which a current flows.

<1-1-6> Cell Current Distribution

As described above, the memory cell MC can store data by using two types of resistance states, i.e., the low-resistance state (data "0") and the high-resistance state (data "1").

The memory device 10 applies a read current to the memory cell MC when reading data. The memory device 10 compares the current flowing in the memory cell MC with a reference current (such as a current flowing in a reference cell) to determine the resistance state of the memory cell MC. The current flowing in the memory cell MC when data is read is called a cell current Icell. There are two types of cell current Icell, i.e., a cell current Icell0 in the low-resistance state and a cell current Icell1 in the high-resistance state. For simplification, the cell current flowing in the memory cell MC that stores data "1" will be expressed as cell current Icell1. The cell current flowing in the memory cell MC that stores data "0" will be expressed as cell current Icell0.

Figure 4:
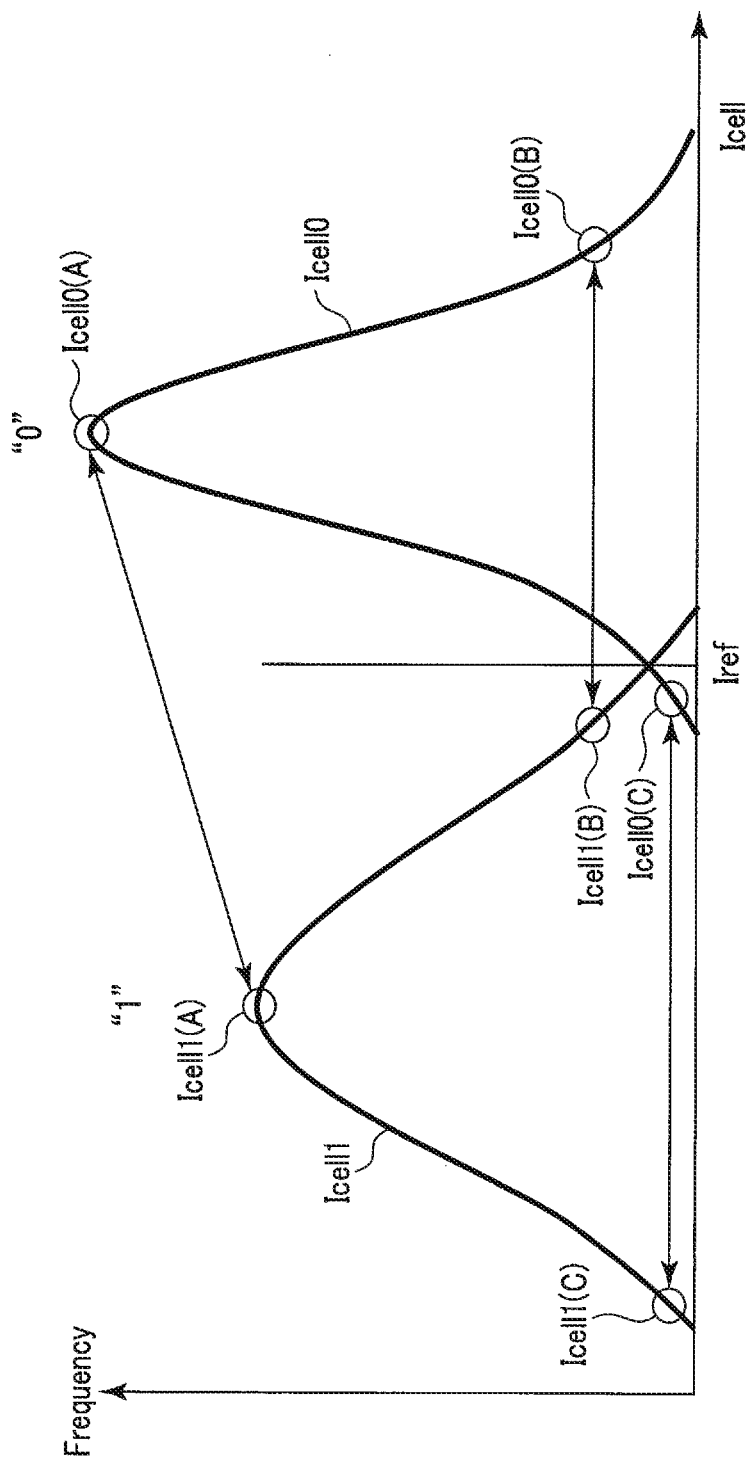
FIG. 4 is a graph showing cell current distribution of the memory system according to the first embodiment.

FIG. 4 is a distribution map of cell currents of all memory cells MC included in the memory array 11.

The memory cells MC may have different characteristics. As shown in FIG. 4, the resistance states for storing data "1" and data "0" may vary among memory cells MC depending on the characteristics of the memory cells MC. Namely, the cell current Icell flowing when storing data "1" varies among memory cells MC. Similarly, the cell current Icell flowing when storing data "0" varies among memory cells MC.

Specifically, the cell current Icell1(A) flowing in memory cell MC(A) that stores data "1" is smaller than the cell current Icell1(B) flowing in memory cell MC(B) that stores data "1". In addition, the cell current Icell1(A) flowing in memory cell MC(A) that stores data "1" is larger than the cell current Icell1(C) flowing in memory cell MC(C) that stores data "1".

Similarly, the cell current Icell0(A) flowing in memory cell MC(A) that stores data "0" is smaller than the cell current Icell0(B) flowing in memory cell MC(B) that stores data "0". In addition, the cell current Icell0(A) flowing in memory cell MC(A) that stores data "0" is larger than the cell current Icell0(C) flowing in memory cell MC(C) that stores data "0".

When determining data of the memory cell MC, the sense amplifier/write driver 12 compares the cell current Icell with the reference current Iref, and determines which of data "1" and data "0" the memory cell MC stores. In the present example, the sense amplifier/write driver 12 determines the data of the memory cell MC as data "1" when the cell current Icell is smaller than the reference current Iref. The sense amplifier/write driver 12 determines the data as data "0" when the cell current Icell is larger than the reference current Iref.

The sense amplifier/write driver 12 can properly determine data as data "1" or data "0" when there is a sufficient difference between the reference current Iref and the cell current Icell, although the detailed description will be omitted for simplification. On the other hand, the sense amplifier/write driver 12 may not properly determine data when there is not a sufficient difference between the reference current Iref and the cell current Icell.

However, the sense amplifier/write driver 12 may cause the following problem if the sense amplifier/write driver 12 makes a determination on the cell current Icell with reference to one reference current Iref. For example, as shown in FIG. 4, there is a sufficient difference between cell current Icell1(C) and the reference current Iref. In contrast, there is not a sufficient difference between cell current Icell1(B) and the reference current Iref. Therefore, the sense amplifier/write driver 12 takes more time for determination on cell current Icell1(B) than for determination on cell current Icell1(C).

The reference current Iref is preferably set at approximately the middle between cell current Icell1 and cell current Icell0. However, as shown in FIG. 4, the distribution of cell current Icell1 or that of cell current Icell0 may be wide-based and overlap each other depending on the characteristics of the memory cell MC. In this case, if the sense amplifier/write driver 12 makes a determination on cell current Icell0(C) by using the reference current Iref, data that should be determined as data "0" is determined as data "1".

To solve the problem as described above, it is possible to change the reference voltage Iref for each memory cell MC, as shown in FIG. 5. The sense amplifier/write driver 12 uses reference current Iref(A) when reading data of memory cell MC(A), uses reference current Iref(B) when reading data of memory cell MC(B), and uses reference current Iref(C) when reading data of memory cell (C). A method for determining the reference current Iref will be described later.

Accordingly, in the present embodiment, the sense amplifier/write driver 12 can make a proper determination on the cell current Icell of each memory cell MC by changing the reference current Iref for each memory cell MC.

Namely, in the present embodiment, as shown in FIG. 4, the states of many memory cells are not determined with reference to one reference cell (reference current), but determined with reference to their own states; therefore, the effect of variation between memory cells can be greatly reduced.

<1-2> Operation

A read operation of the memory system according to the first embodiment will be described. Described in the present embodiment is the case where the read method in which a reference current Iref is derived for each memory cell MC as mentioned above.

<1-2-1> Flow

Figure 6:
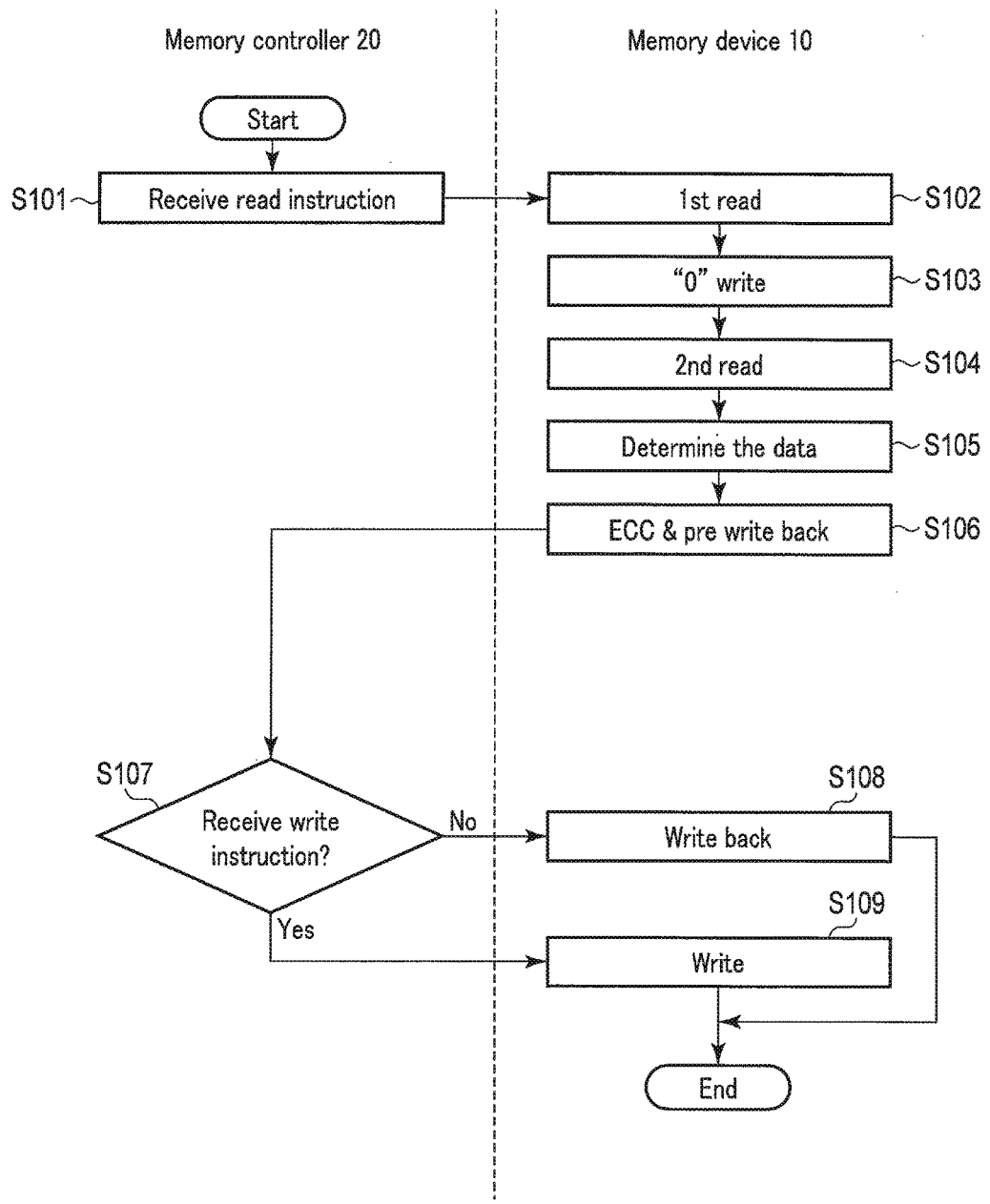
FIG. 6 is a flowchart of a read operation of the memory system according to the first embodiment.

A flow of the read operation of the memory system according to the first embodiment will be described with reference to FIG. 6.

[Step S101]

Upon receipt of a read instruction from the host 2, the memory controller 20 issues an active command and a read command for the memory device 10.

[Step S102]

Upon receipt of the active command and the read command from the memory controller 20, the memory device 10 performs a first read operation (1st Read) on a read-target memory cell group. Information (cell current Icell) read by the first read operation is stored in, for example, a capacitor with a switch (not shown) in the sense amplifier/write driver 12, as a current or a voltage. When step S102 is performed, the reference current has not be determined, and the memory device 10 does not determine data stored in the read-target memory cell group. Namely, the memory device 10 performs a data determination after deriving a reference current as will be described later.

[Step S103]

The memory device 10 performs a "0" write operation on the memory cell group determined as a target of the first read operation. Data of the memory cell group determined as a target of the first read operation is thereby all rewritten as data "0". This "0" write operation is an operation for deriving a reference current as will be described later.

[Step S104]

The memory device 10 performs a second read operation (2nd Read) on the memory cell group determined as the target of the first read operation. Information (cell current Icell0) read by the second read operation is stored in, for example, a capacitor with a switch (not shown) in the sense amplifier/write driver 12, as a current or a voltage. A cell current Icell0 for each memory cell MC is obtained by step S103 and step S104.

[Step S105]

The sense amplifier/write driver 12 uses information (cell current Icell0) read by the second read operation to derive a reference voltage Iref relating to the read-target cell.

A method for deriving a reference voltage Iref will be described with reference to FIG. 7.

The sense amplifier/write driver 12 can derive a reference current Iref based on cell current Icell0 and an offset current Ioffset. Specifically, the reference current Iref can be derived based on the formula, Iref=Icell0−Ioffset. The offset current Ioffset is derived, for example, in a test process prior to shipping of the memory system 1, and is stored, for example, in the sense amplifier/write driver 12. The sense amplifier/write driver 12 derives a reference current Iref by using cell current Icell0 stored, for example, in the capacitor with a switch (not shown) in the sense amplifier/write driver 12 and the offset current Ioffset stored in a memory (not shown) in the sense amplifier/write driver 12.

A method for deriving the offset current Ioffset is now described. The offset current Ioffset is derived based on the formula, Ioffset=Z×σIcell0=(μIcell0−μIcell1)×σIcell0/(σIcell0+σIcell1).

Z is a given value, μIcell1 is an average value of cell currents Icell1, and σIcell1 is a standard deviation of cell currents Icell1. μIcell0 is an average value of cell currents Icell0, and σIcell0 is a standard deviation of cell currents Icell0.

The sense amplifier/write driver 12 uses the derived reference voltage Iref to determine data relating to "information read by the first read operation" stored, for example, in the capacitor with a switch (not shown) in the sense amplifier/write driver 12. Namely, the sense amplifier/write driver 12 compares the cell current Icell with the reference current Iref to determine which of data "1" and data "0" the memory cell MC stores.

In the method for deriving a reference current as described above, the reference current Iref varies with reference to cell current Icell0 (or cell current Icell1 or both). Therefore, as shown in FIG. 8, a reference current Iref(C) appropriate for cell current Icell0(C) and cell current Icell1 (C) can be derived.

As a result, read errors can be reduced in comparison with the method for determining data by using one reference current.

The sense amplifier/write driver 12 derives a reference current Iref based on cell current Icell0 and the offset current Ioffset, but may derive the reference current Iref based on cell current Icell1 and the offset current Ioffset. In this case, the reference current Iref can be derived based on the formula, Iref=Icell1+Ioffset.

In this case, in step S103, the memory device 10 needs to perform a "1" write operation on the memory cell group determined as the target of the first read operation. As a result, the memory device 10 can obtain cell current Icell1 in step S104.

In addition, the offset current Ioffset is derived based on the formula, Ioffset=Z×σIcell1=(μIcell0−μIcell1)×σIcell1/(σIcell0+σIcell1).

As described above, the offset current Ioffset is derived, for example, in a test process prior to shipping of the memory system 1, and is stored, for example, in the sense amplifier/write driver 12. The sense amplifier/write driver 12 can derive a reference current Iref by using cell current Icell1 stored, for example, in the capacitor with a switch (not shown) in the sense amplifier/write driver 12 and the offset current Ioffset stored in a memory (not shown) in the sense amplifier/write driver 12.

The sense amplifier/write driver 12 uses the derived reference voltage Iref to determine data relating to "information read by the first read operation" stored, for example, in the capacitor with a switch (not shown) in the sense amplifier/write driver 12.

[Step S106]

The subsequent read operation will be described by referring back to FIG. 6.

The ECC circuit 19 performs error correction processing (hereinafter sometimes referred to as "ECC" for simplification) based on data determined in step S105. After the error correction processing, the memory device 10 supplies the memory controller 20 with a result of the error correction processing (such as error-corrected data). The error-corrected data is stored in the register 19a in the ECC circuit 19.

In addition, the memory device 10 writes back data determined by step S105 into the read-target memory cell group. The operation for writing back data before deriving an error correction result back into the memory cell group as described above is referred to as, for example, a pre write back operation.

Namely, the memory device 10 approximately simultaneously performs the error correction processing and the pre write back operation.

[Step S107]

When receiving a write instruction, the memory controller 20 issues a write command for the memory device 10, and supplies the data line DQ with write data. Subsequently, the memory controller 20 issues a pre-charge command for the memory device 10. (YES in Step S107). In the other cases, the memory controller 20 issues a pre-charge command for the memory device 10 (NO in step S107).

[Step S108]

Upon receipt of the pre-charge command, the memory device 10 performs a write back operation for writing back the result of error correction processing obtained by step S106 (data stored in register 19a) into the memory cell group. The memory cell group already stores data before error correction processing. Therefore, in step S108, a write operation is performed only on memory cells MC storing error data.

[Step S109]

Upon receipt of the write data and the pre-charge command from the memory controller, the memory device 10 performs a write operation. When the write operation is performed on the memory cell group determined as a read-target in step S102, the memory device 10 overwrites data without performing the write back operation.

<1-2-2> Timing Chart

Next, a specific timing chart of the read operation of the memory system according to the first embodiment will be described with reference to FIG. 9.

[Time T0]

Upon receipt of a read instruction from the host 2, the memory controller 20 first issues an active command ACT for the memory device 10. Upon receipt of the active command ACT, the memory device 10 transitions to an active state.

[Time T1]

After issuing the active command ACT, the memory controller 20 issues a read command READ for the memory device 10 (step S101).

[Time T2]

Upon receipt of the read command READ, the memory device 10 first performs a first read operation (step S102). At this time, a consumption current increases in the memory device 10. Specifically, for example, the consumption current I(VDD) relating to the source voltage VDD and the consumption current I(VSS) relating to the ground voltage VSS increase.

[Time T3]

Next, the memory device 10 performs a "0" write operation (step S103). The consumption current required for the write operation is larger than the consumption current required for the read operation. Therefore, the consumption current further increases in the memory device 10. Specifically, for example, consumption current I(VDD) and consumption current I(VSS) further increase.

[Time T4]

Next, the memory device 10 performs a second read operation (step S104). At this time, the consumption current decreases in the memory device 10. Specifically, for example, consumption current I(VDD) and consumption current I(VSS) decrease.

[Time T5]

Next, the memory device 10 performs a data determination operation (step S105). The memory device 10 thereby determines data read by the first read operation.

[Time T6]

Next, the memory device 10 performs error correction processing and a pre write back operation by using the determined data (step S106). The pre write back operation essentially corresponds to the "1" write operation, and the consumption current required for the pre write back operation is larger than that required for the read operation. Therefore, the consumption current further increases in the memory device 10. Specifically, for example, consumption current I(VDD) and consumption current I(VSS) further increase.

[Time T7]

Upon completion of the error correction processing, the memory device 10 transmits an error correction processing result (specifically, error-corrected data) to the memory controller 20 via the data line DQ.

The memory controller 20 receives the error correction processing result from the memory device 10.

[Time T8]

The memory controller 20 issues a pre-charge command PRE at a given time (step S107).

[Time T9]

Upon receipt of the pre-charge command PRE, the memory device 10 performs a pre-charge operation, and further performs a write back operation (step S108). The write operation performed here is that for correcting only data determined as an "error" in step S106. Therefore, the consumption current is smaller than that of a normal write operation.

<1-3> Advantage

According to the above-described embodiment, the memory device 10 approximately simultaneously performs the error correction processing and the pre write back operation. The pre write back operation enables the memory device 10 to restore read data of the cell group.

To facilitate understanding of the advantage of the present embodiment, a comparative example will be described.

As shown in FIG. 10, time T16, in the comparative example, the memory device 10 does not perform a pre write back operation. The memory device 10 according to the comparative example performs a write back operation at time T19 after the pre-charge command PRE is issued. In the write back operation at time T19, the memory device 10 writes back data "1" into the memory cell group in which data "0" has been written; therefore, a consumption current larger than in the write back operation in the present embodiment is required.

After the pre-charge command PRE is issued, the memory device uses a current for an operation not shown in the figure. Therefore, when a write back operation is performed simultaneously on many memory cell groups, operation currents are concentrated. Therefore, even when the memory device tries to write back data, data may not be correctly written due to a decrease in the source potential.

In addition, according to the comparative example, the memory cell group determined as a read-target is in a state where data "0" is overwritten until the memory controller 20 issues a pre-charge command PRE at time T18. However, the pre-charge command PRE is issued at a given time, and when it is issued is unknown. The power of the memory system 1 may be shut out between time T17 and time T18. In such a case, error-corrected data stored in the register 19a in the ECC circuit 19 is lost. Thus, the memory device 10 cannot correctly perform a write back operation on the memory cell group determined as a read-target. This causes a problem of data being lost from the memory cell group determined as a read-target.

However, in the read operation of the memory system according to the present embodiment, error correction processing and a pre write back operation are performed approximately simultaneously (see time T6 onward in FIG. 9). The consumption current of the memory device 10 from time T6 onward in FIG. 9 is smaller than the consumption current of the memory device 10 from time T19 onward in FIG. 10. This is because the memory device according to the comparative example uses a current for an operation not shown in the figure at time T19, as described above. Unlike in the comparative example, the pre write back operation is performed when a current is not used for an operation not shown in the figure in the present embodiment. Therefore, even when a pre write back operation is performed simultaneously on many memory arrays, a decrease in the source potential can be inhibited. As a result, the pre write back operation can be correctly performed.

In the read operation of the memory system according to the present embodiment, the memory cell group determined as a read-target stores data before error correction processing, not data "0", until the pre-charge command PRE is issued. Accordingly, even if the power of the memory system 1 is shut out before the pre-charge command PRE is issued, the memory cell group determined as a read-target at least keeps data before error correction. If the power of the memory system 1 is shut out before the pre-charge command PRE is issued, error-corrected data can be written back by performing error correction processing again. Therefore, the problem that data is lost from the memory cell group determined as a read-target can be solved. Namely, the present embodiment can provide a high-quality memory device that can inhibit data loss.

<2> Second Embodiment

The second embodiment will be described. Described in the second embodiment is the case where the write back operation is performed immediately after error correction processing. The basic configuration and basic operation of the memory device according to the second embodiment are the same as those of the memory device according to the above-described first embodiment. Thus, descriptions of matters described in the first embodiment and matters inferable from the first embodiment will be omitted.

<2-1> Operation

A read operation of a memory system according to the second embodiment will be described.

<2-1-1> Flow

Figure 11:
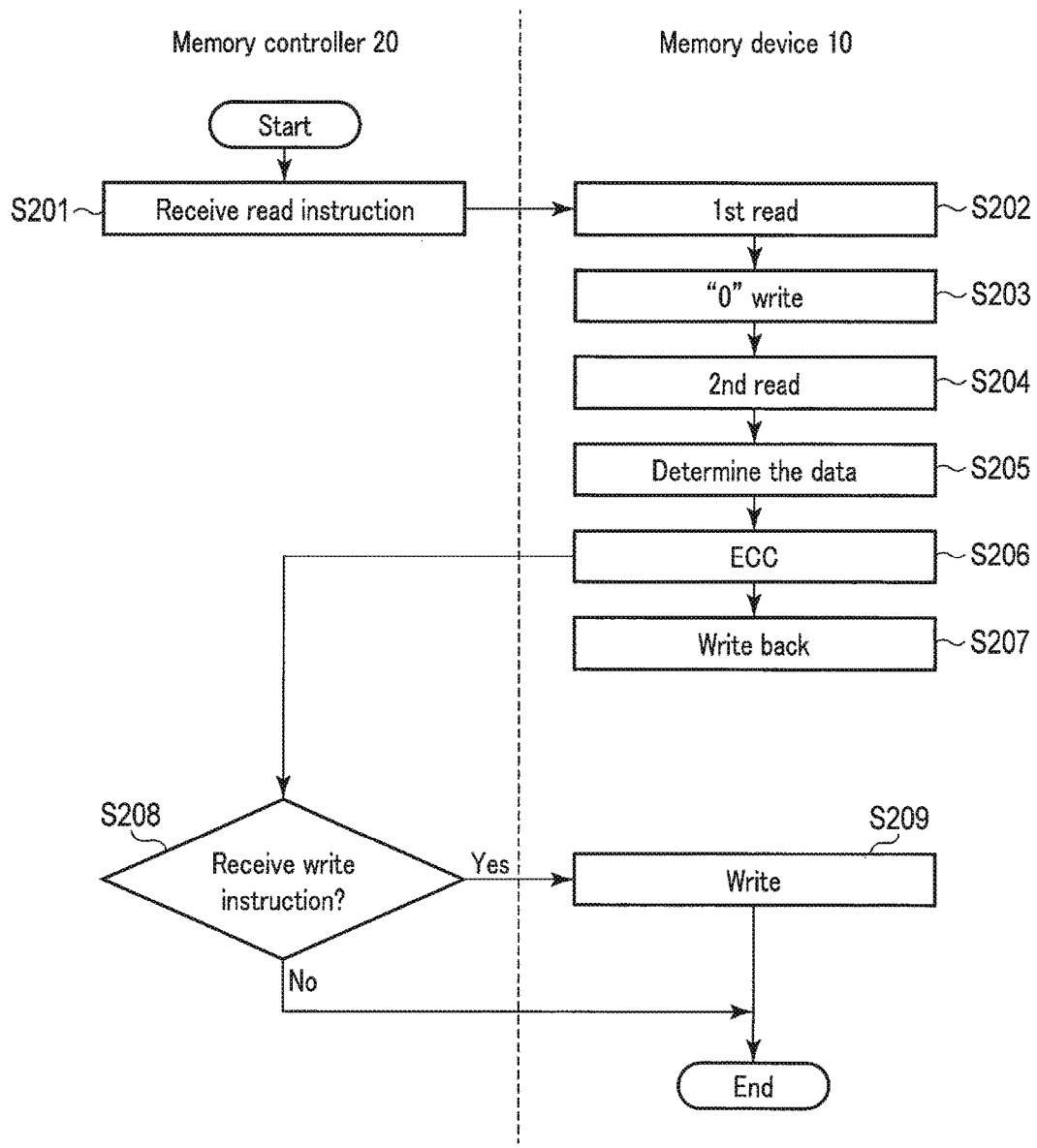
FIG. 11 is a flowchart of a read operation of a memory system according to a second embodiment.
Figure 13:
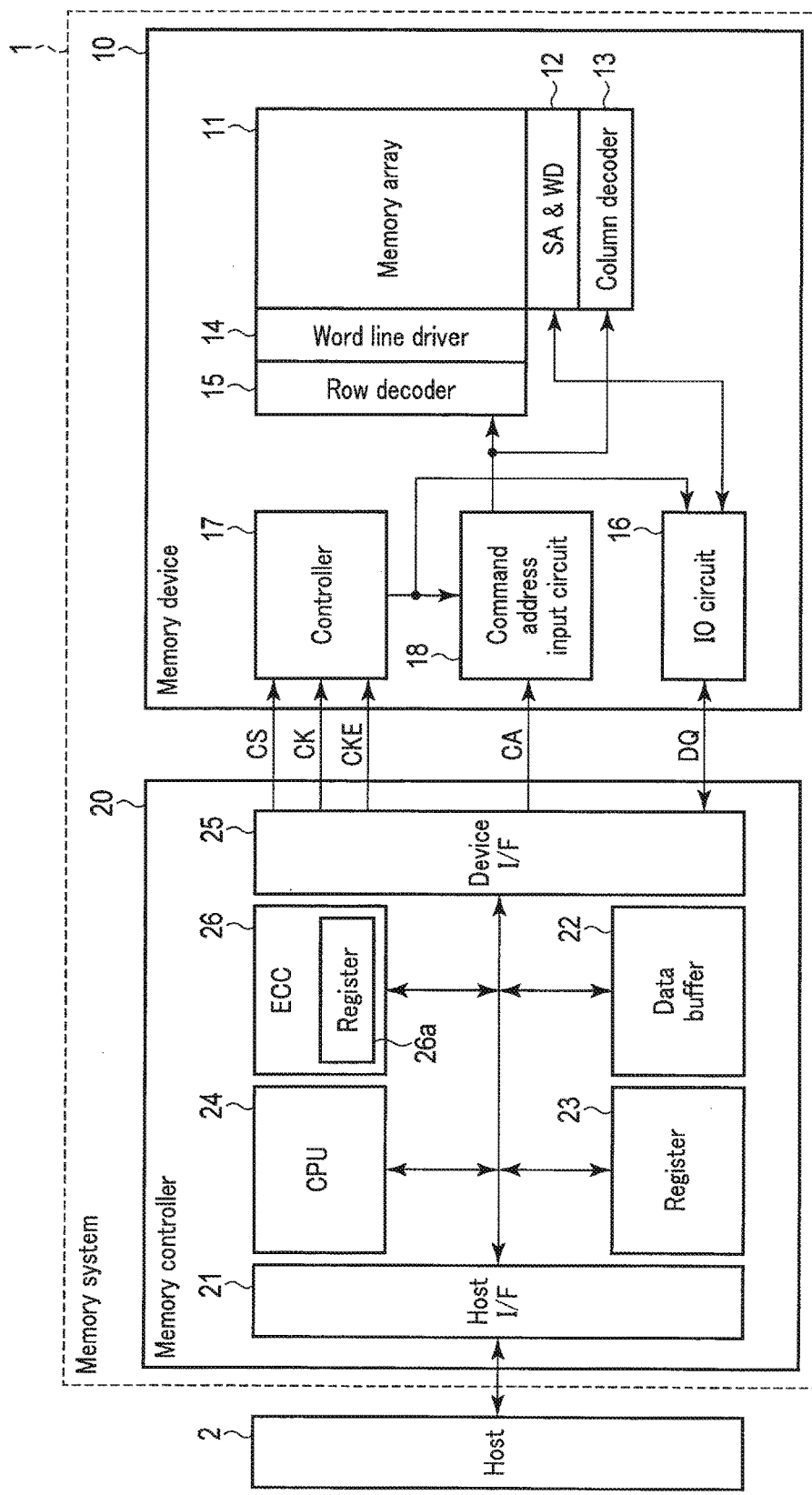
FIG. 13 is a block diagram showing a configuration of a memory system according to a third embodiment.

A flow of the read operation of the memory system according to the second embodiment will be described with reference to FIG. 11.

[Step S201] to [Step S205]

The memory system 1 performs the same operation as the operation from step S101 to step S105 described in the first embodiment.

[Step S206]

The ECC circuit 19 performs error correction processing based on data determined in step S205. After the error correction processing, the memory device 10 supplies the memory controller 20 with a result of the error correction processing (such as error-corrected data). The error-corrected data is stored in the register 19a in the ECC circuit 19.

[Step S207]

The memory device 10 performs a write back operation for writing back the result of error correction processing obtained by step S206 (data stored in register 19a) into the memory cell group.

[Step S208]

The memory system 1 performs the same operation as the operation in step S107 described in the first embodiment.

[Step S209]

The memory system 1 performs the same operation as the operation in step S109 described in the first embodiment.

<2-1-2> Timing Chart

Next, a specific timing chart of the read operation of the memory system according to the second embodiment will be described with reference to FIG. 12.

[Time T20] to [Time T25]

The memory system 1 performs the same operation as the operation from time T0 to time T5 described in the first embodiment (step S201 to step S205).

[Time T26]

Next, the memory device 10 performs error correction processing (step S206). The consumption current required for the error correction processing is smaller than the consumption current required for the read operation.

Therefore, the consumption current decreases in the memory device 10. Specifically, for example, consumption current I(VDD) and consumption current I(VSS) decrease.

[Time T27]

Next, the memory device 10 performs a write back operation (step S207). The write back operation essentially corresponds to the "1" write operation, and the consumption current required for the write back operation is larger than that required for the read operation and the error correction processing. Therefore, the consumption current increases in the memory device 10. Specifically, for example, consumption current I(VDD) and consumption current I(VSS) further increase.

[Time T28] to [Time T29]

The memory system 1 performs the same operation as the operation from time T7 to time T8 described in the first embodiment (step S208).

<2-2> Advantage

According to the above-described embodiment, the memory device 10 performs a write back operation immediately after error correction processing. Therefore, as described in <1-3> of the first embodiment, the write back operation can be performed with stability. In addition, even if the power of the memory system 1 is shut out before the pre-charge command PRE is issued, the memory cell group stores error-corrected data written back therein to as described in <1-3> of the first embodiment. Namely, the present embodiment can provide a high-quality memory device that can inhibit data loss.

<3> Third Embodiment

The third embodiment will be described. Described in the third embodiment is the case where the ECC circuit is provided in the memory controller. The basic configuration and basic operation of the memory device according to the third embodiment are the same as those of the memory device according to the above-described first embodiment. Thus, descriptions of matters described in the first embodiment and matters inferable from the first embodiment will be omitted.

<3-1> Configuration of Memory Controller

The memory controller 20 according to the embodiment further includes an ECC circuit 26.

The ECC circuit 26 receives, via the data buffer 22, write data from the host 2. The ECC circuit 26 adds an error correcting code to the write data. The ECC circuit 26 supplies the write data including the added error correcting code to the data buffer 22 or the device interface 25, for example.

In addition, the ECC circuit 26 receives data supplied from the memory device 10 via the device interface 25. The data is data stored in a memory cell group of the memory array 11. The ECC circuit 26 evaluates whether the data received from the memory device 10 contains an error. When the ECC circuit 26 determines that the received data contains an error, the ECC circuit 26 performs error correction processing on the received data by using an error correcting code. Then, the ECC circuit 26 supplies the error-corrected data to the data buffer 22, the device interface 25, etc.

The ECC circuit 26 includes a register 26a. The register 26a is, for example, a volatile memory, and stores error-corrected data. The register 26a may be either a volatile memory or a nonvolatile memory.

<3-2> Operation

A read operation of the memory system according to the third embodiment will be described.

<3-2-1> Flow

Figure 14:
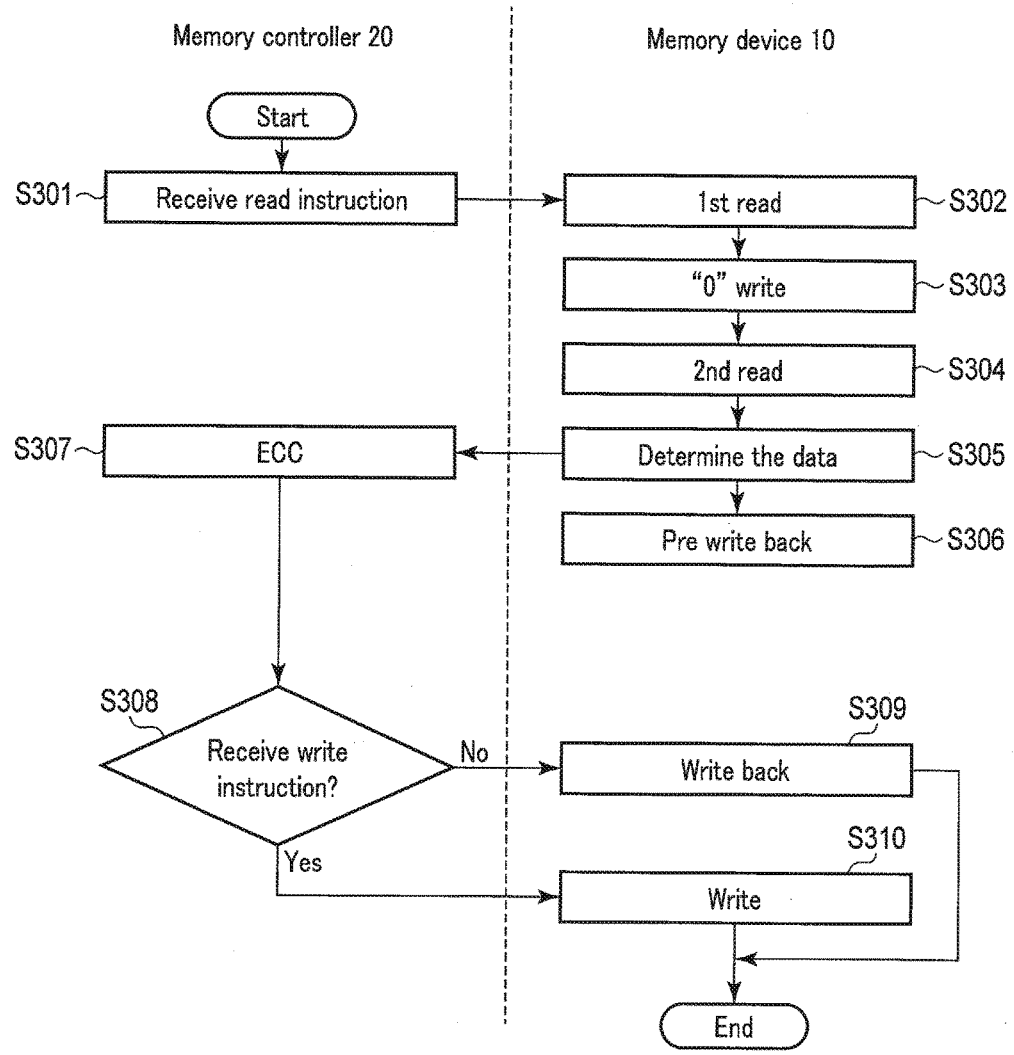
FIG. 14 is a flowchart of a read operation of the memory system according to the third embodiment.

A flow of the read operation of the memory system according to the third embodiment will be described with reference to FIG. 14.

[Step S301] to [Step S304]

The memory system 1 performs the same operation as the operation from step S101 to step S104 described in the first embodiment.

[Step S305]

The memory system 1 performs the same operation as the operation in step S105 described in the first embodiment.

In addition, the memory device 10 supplies the ECC circuit 26 with the determined data.

[Step S306]

The memory device 10 writes back the data determined by step S305 into the read-target memory cell group (pre write back operation).

[Step S307]

The ECC circuit 26 performs error correction processing based on the data determined by step S305. The error-corrected data is stored in the register 26a in the ECC circuit 26.

[Step S308]

When receiving a write instruction, the memory controller 20 issues a write command for the memory device 10, and supplies the data line DQ with write data. Subsequently, the memory controller 20 issues a pre-charge command for the memory device 10 (YES in step S308). In the other cases, the memory controller 20 issues a pre-charge command for the memory device 10, and supplies the data line DQ with error-corrected data stored in register 26a (NO in step S308).

[Step S309]

Upon receipt of the pre-charge command and the error-corrected data, the memory device 10 performs a write back operation for writing back the error-corrected data into the memory cell group. The memory cell group already stores data before error correction processing. Therefore, in step S308, a write operation is performed only on error memory cells MC.

[Step S310]

The memory system 1 performs the same operation as the operation in step S109 described in the first embodiment.

<3-2-2> Timing Chart

Next, a specific timing chart of the read operation of the memory system according to the third embodiment will be described with reference to FIG. 15.

[Time T30] to [Time T35]

The memory system 1 performs the same operation as the operation from time T0 to time T5 described in the first embodiment (step S301 to step S305).

[Time T36]

The memory device 10 supplies the memory controller 20 with determined data (Data 1) via the data line DQ.

Then, the memory device 10 performs a pre write back operation (step S306). The pre write back operation essentially corresponds to the "1" write operation, and the consumption current required for the pre write back operation is larger than that required for the read operation. Therefore, the consumption current further increases in the memory device 10. Specifically, for example, consumption current I(VDD) and consumption current I(VSS) further increase.

[Time T37]

Next, the memory device 20 performs error correction processing (step S307).

[Time T38]

The memory controller 20 issues a pre-charge command PRE and transmits error-corrected data (Dada 2) (step S308).

[Time T39]

Upon receipt of the pre-charge command PRE and the error corrected data, the memory device 10 performs a pre-charge operation, and further performs a write back operation (step S309). The write operation performed here is that for correcting only data determined as an "error" in step S307. Therefore, the consumption current is smaller than that of a normal write operation.

<3-3> Advantage

According to the above-described embodiment, the memory device 10 performs a pre write back operation before error correction processing. Therefore, the third embodiment can perform the same advantage as the first embodiment.

To facilitate understanding of the advantage of the present embodiment, a comparative example will be described.

Figure 16:
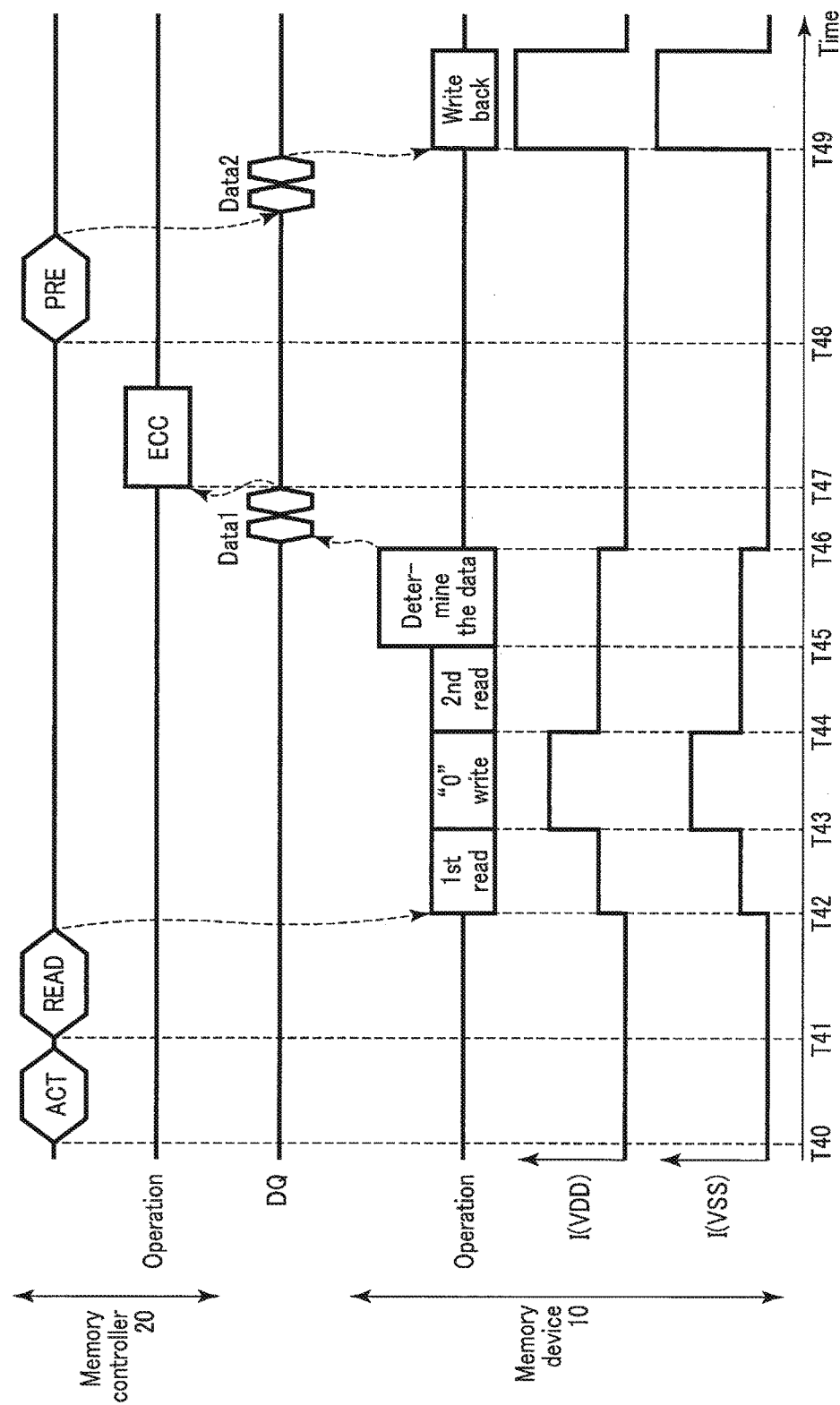
FIG. 16 is a timing chart relating to an example of the read operation of a memory system according to a comparison example of the third embodiment.

As shown in FIG. 16, time T46, in the comparative example, the memory device 10 does not perform a pre write back operation. The memory device 10 according to the comparative example performs a write back operation at time T49 after the pre-charge command PRE is issued. In the write back operation at time T49, the memory device 10 writes back data "1" into the memory cell group in which data "0" has been written; therefore, a larger consumption current is required than in the write back operation in the present embodiment.

After the pre-charge command PRE is issued, the memory device uses a current for an operation not shown in the figure. Therefore, when a write back operation is performed simultaneously on many memory cell groups, operation currents are concentrated. Therefore, even when the memory device tries to write back data, data may not be correctly written due to a decrease in the source potential.

In addition, according to the comparative example, the memory cell group determined as a read-target is in a state where data "0" is overwritten until the memory controller 20 issues a pre-charge command PRE at time T48. However, the pre-charge command PRE is issued at a given time, and when it is issued is unknown. The power of the memory system 1 may be shut out between time T47 and time T48. In such a case, error-corrected data stored in the register 26*a* in the ECC circuit 26 is lost. Thus, the memory device 10 cannot correctly perform a write back operation on the memory cell group determined as a read-target. This causes a problem that data is lost from the memory cell group determined as a read-target.

Figure 15:
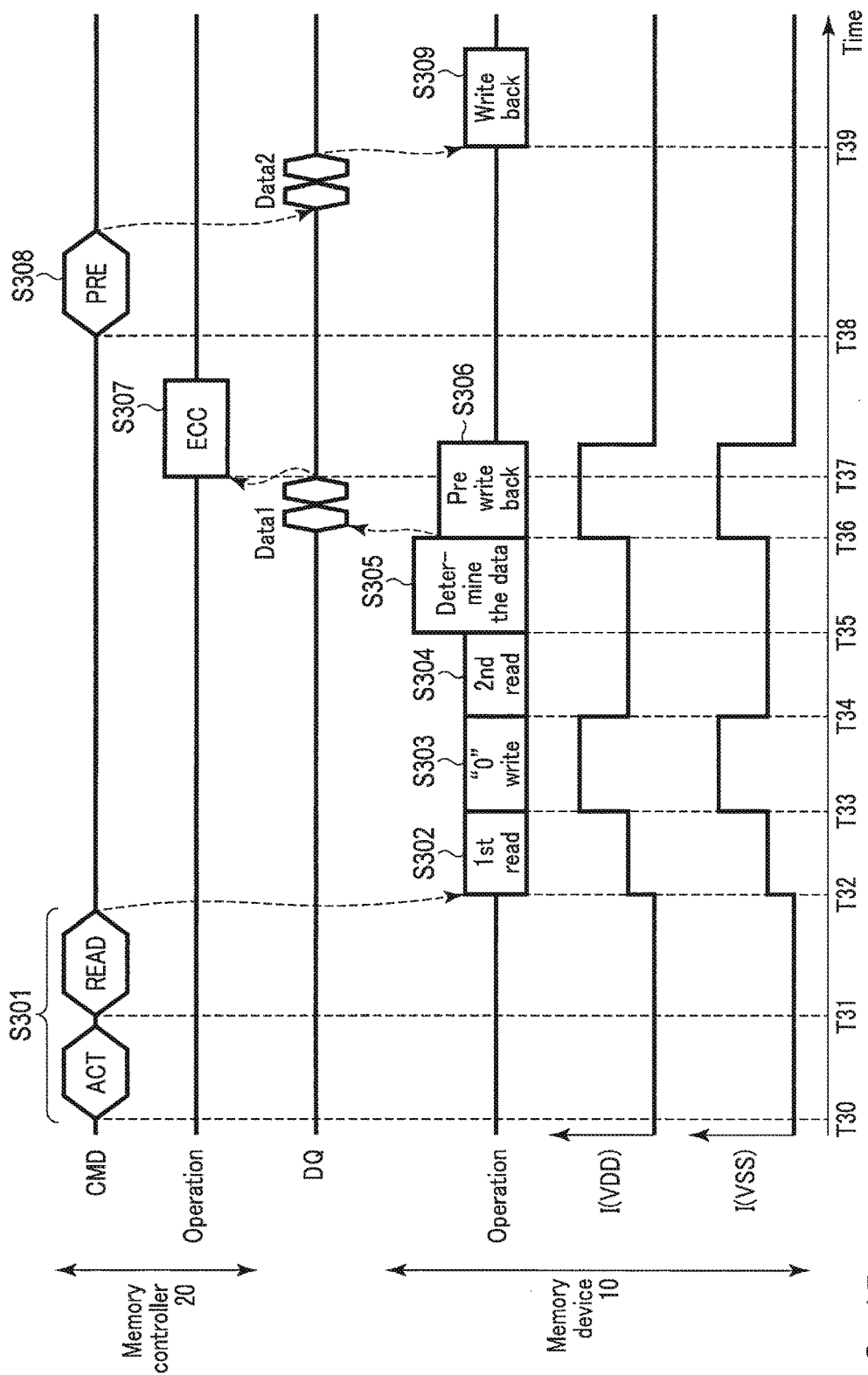
FIG. 15 is a timing chart relating to an example of the read operation of the memory system according to the third embodiment.

However, in the read operation of the memory system according to the present embodiment, a pre-write back operation is performed immediately after data is determined (see time T36 onward in FIG. 15). The consumption current of the memory device 10 from time T36 onward in FIG. 15 is smaller than the consumption current of the memory device 10 from time T49 onward in FIG. 16. This is because the memory device according to the comparative example uses a current for an operation not shown in the figure at time T49, as described above. Unlike in the comparative example, the pre write back operation is performed when a current is not used for an operation not shown in the figure in the present embodiment. Therefore, even when a pre write back operation is performed simultaneously on many memory arrays, a decrease in the source potential can be inhibited. As a result, the pre-write back operation can be correctly performed.

In the read operation of the memory system according to the present embodiment, the memory cell group determined as a read-target stores data before error correction processing, not data "0", until the pre-charge command PRE is issued. Accordingly, even if the power of the memory system 1 is shut out before the pre-charge command PRE is issued, the memory cell group determined as a read-target at least keeps data before error correction. If the power of the memory system 1 is shut out before the pre-charge command PRE is issued, error-corrected data can be written back by performing error correction processing again. Therefore, the problem that data is lost from the memory cell group determined as a read-target can be solved. Namely, the present embodiment can provide a high-quality memory device that can inhibit data loss.

<4> Fourth Embodiment

The fourth embodiment will be described. Described in the fourth embodiment is the case where a write back operation is performed immediately after error correction processing. The basic configuration and basic operation of the memory device according to the fourth embodiment are the same as those of the memory device according to the above-described third embodiment. Thus, descriptions of matters described in the third embodiment and matters inferable from the third embodiment will be omitted.

<4-1> Operation

A read operation of a memory system according to the fourth embodiment will be described.

<4-1-1> Flow

A flow of the read operation of the memory system according to the fourth embodiment will be described with reference to FIG. 17.

[Step S401] to [Step S405]

The memory system 1 performs the same operation as the operation from step S301 to step S305 described in the third embodiment.

[Step S406]

The memory system 1 performs the same operation as the operation in step S307 described in the third embodiment.

Then, the memory controller 20 supplies the memory device 10 with error-corrected data.

[Step S407]

The memory device 10 performs a write back operation for writing back error-corrected data obtained by step S406 into the memory cell group.

[Step S408]

The memory system 1 performs the same operation as the operation in step S307 described in the third embodiment.

[Step S409]

The memory system 1 performs the same operation as the operation in step S310 described in the third embodiment.

Figure 18:
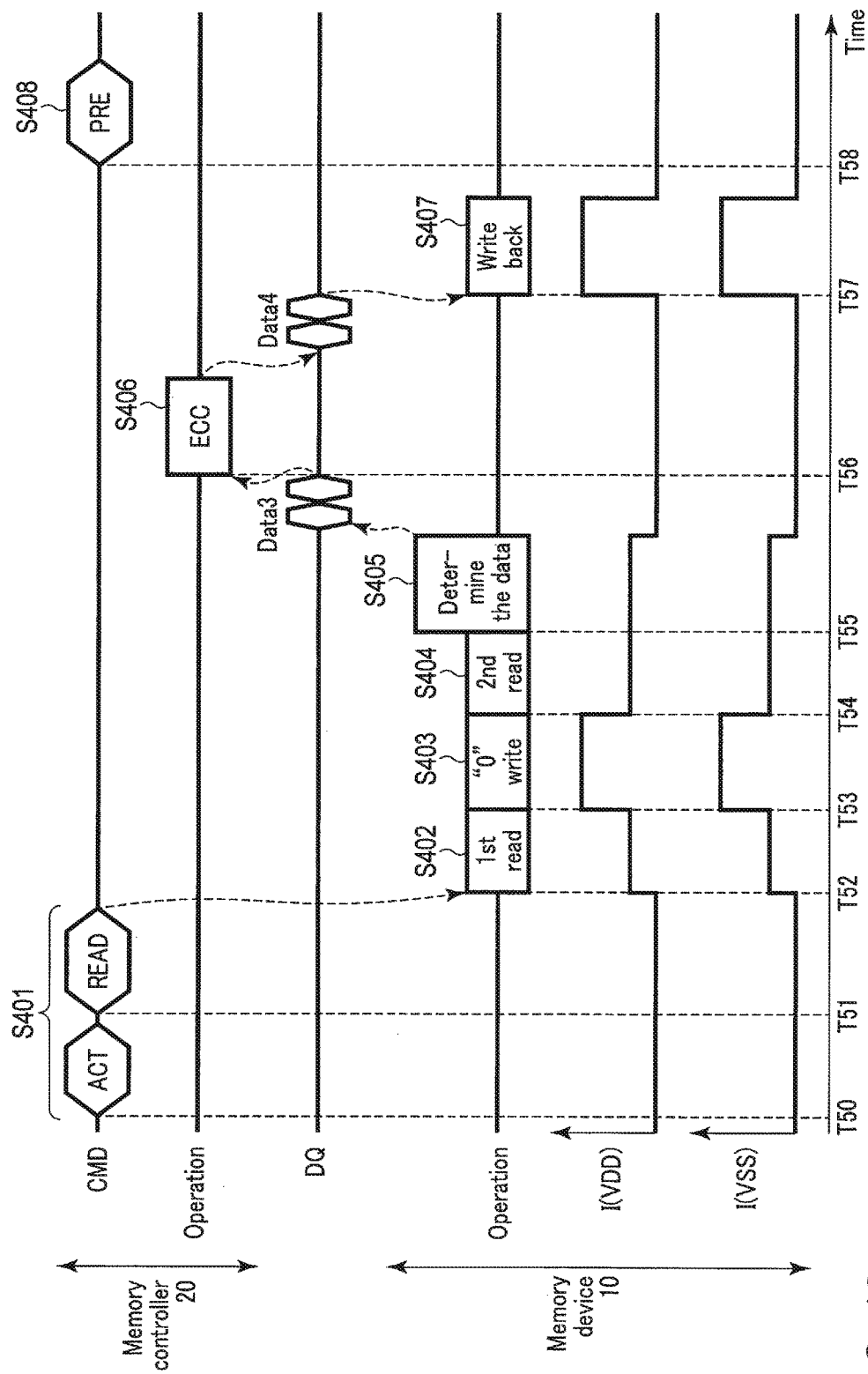
FIG. 18 is a timing chart relating to an example of the read operation of the memory system according to the fourth embodiment.

<4-1-2> Timing Chart Next, a specific timing chart of the read operation of the memory system according to the fourth embodiment will be described with reference to FIG. 18.

[Time T50] to [Time T55]

The memory system 1 performs the same operation as the operation from time T30 to time T35 described in the third embodiment (step S401 to step S405).

[Time T56]

Next, upon receipt of data (Data 3) from the memory device 10, the memory controller 20 performs error correction processing (step S406).

[Time T57]

Next, upon receipt of error-corrected data (Data 4) from the memory controller 20, the memory device 10 performs a write back operation (step S407). The write back operation essentially corresponds to the "1" write operation, and the consumption current required for the write back operation is larger than that required for the read operation. Therefore, the consumption current increases in the memory device 10. Specifically, for example, consumption current I(VDD) and consumption current I(VSS) further increase.

[Time T58]

The memory controller 20 issues a pre-charge command PRE (step S408).

<4-2> Advantage

According to the above-described embodiment, the memory device 10 performs a write back operation immediately after error correction processing. Therefore, as described in <3-3> of the third embodiment, the write back operation can be performed with stability. In addition, even if the power of the memory system 1 is shut out before the pre-charge command PRE is issued, the memory cell group stores error-corrected data written back therein as described in <3-3> of the third embodiment. Namely, the present embodiment can provide a high-quality memory device that can inhibit data loss.

<5> Fifth Embodiment

The fifth embodiment will be described. Described in the fifth embodiment is a method for using a redundancy area in the memory array. The basic configuration and basic operation of the memory device according to the fifth embodiment are the same as those of the memory device according to the above-described first to fourth embodiments. Thus, descriptions of matters described in the first to fourth embodiments and matters inferable from the first to fourth embodiments will be omitted.

<5-1> Configuration of Memory Device

A memory system 1 according to the fifth embodiment will be described with reference to FIG. 19.

Figure 19:
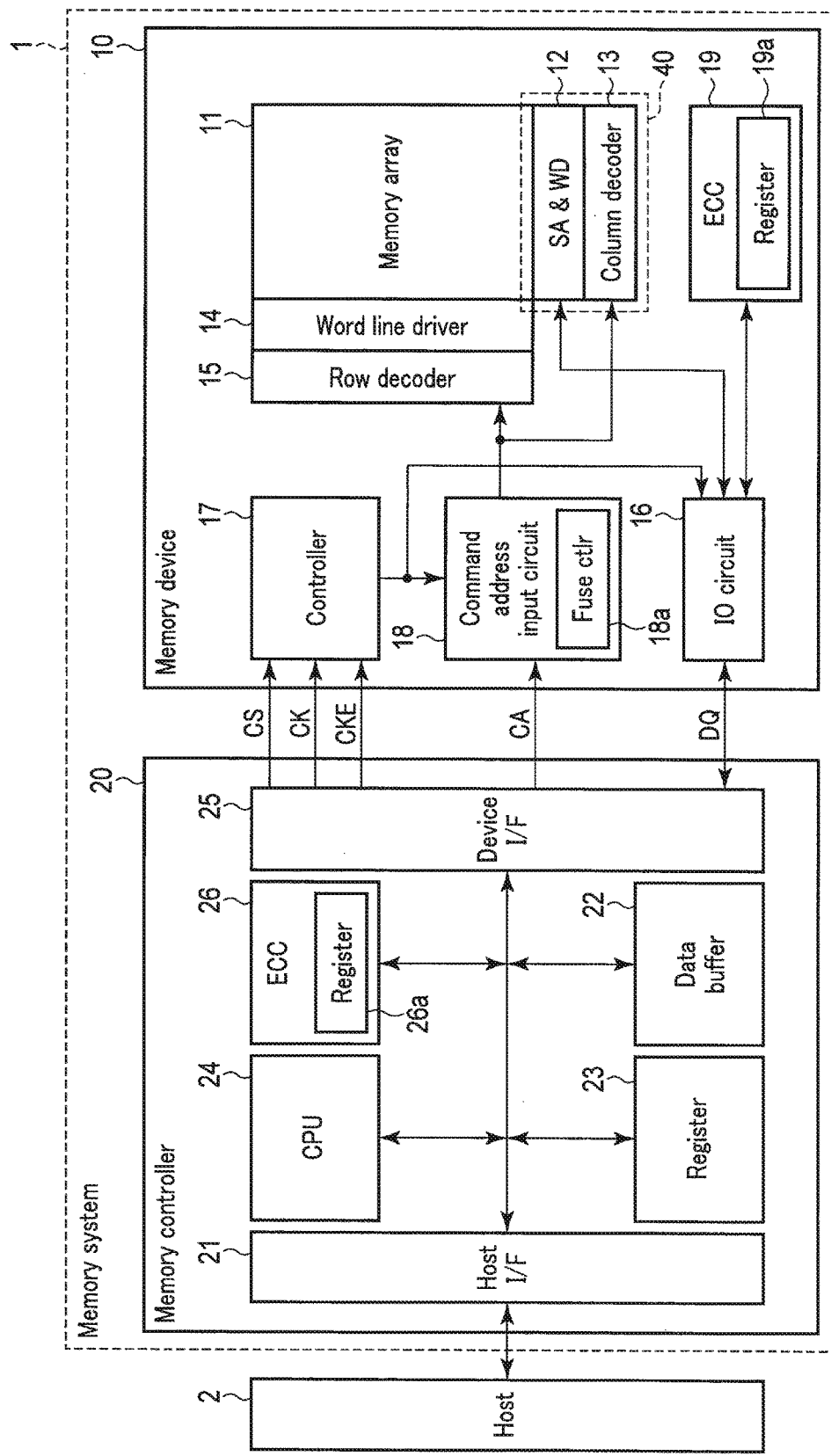
FIG. 19 is a block diagram showing a configuration of a memory system according to a fifth embodiment.

As shown in FIG. 19, a command address input circuit 18 according to the fifth embodiment includes a fuse controller (fuse ctlr) 18a. In this example, the fuse controller 18a is included in the command address input circuit 18, but the installation place is not limited thereto. Specifically, the fuse controller 18a may be provided outside the command address input circuit 18.

In the memory system 1 shown in FIG. 19, the memory device 10 and the memory controller 20 each include an ECC circuit, but at least one ECC circuit is acceptable. Of course, both of the ECC circuits of the memory device 10 and the memory controller 20 may be used.

ECC circuit 19 adds an error correcting parity and an error detecting parity to write data. ECC circuit 19 supplies the write data including the added error correcting parity and error detecting parity to the sense amplifier/write driver 12.

ECC circuit 19 also receives data from the memory array 11. ECC circuit 19 detects an error in the received data based on the error detecting parity. If ECC circuit 19 detects an error in the received data and the detected error is correctable, ECC circuit 19 performs error correction processing on the received data by using the error correcting parity. ECC circuit 19 supplies the error-corrected data to the memory controller 20 via the IO circuit 16, for example.

ECC circuit 26 adds the error correcting parity and the error detecting parity to the write data. ECC circuit 26 supplies the write data including the added error correcting parity and error detecting parity to the data buffer 22 or the device interface 25, for example.

In addition, ECC circuit 26 receives data supplied from the memory device 10 via the device interface 25. ECC circuit 26 detects an error in the data received from the memory device 10 by using the error detecting parity. If ECC circuit 26 detects an error in the received data and the detected error is correctable, ECC circuit 26 performs error correction processing on the received data by using the error correcting parity. Then, ECC circuit 26 supplies the error-corrected data to, for example, the data buffer 22, the device interface 25, etc.

Hereinafter, when ECC circuit 19 and ECC circuit 26 are not distinguished from each other, they will be merely called an ECC circuit.

In the present embodiment, the sense amplifier/write driver 12 and the column decoder 13 will be treated as a column controller 40 for simplification of the explanation.

<5-2> Configuration of Memory Array and its Periphery

Next, a configuration of the memory array and its periphery will be described with reference to FIG. 20.

Figure 20:
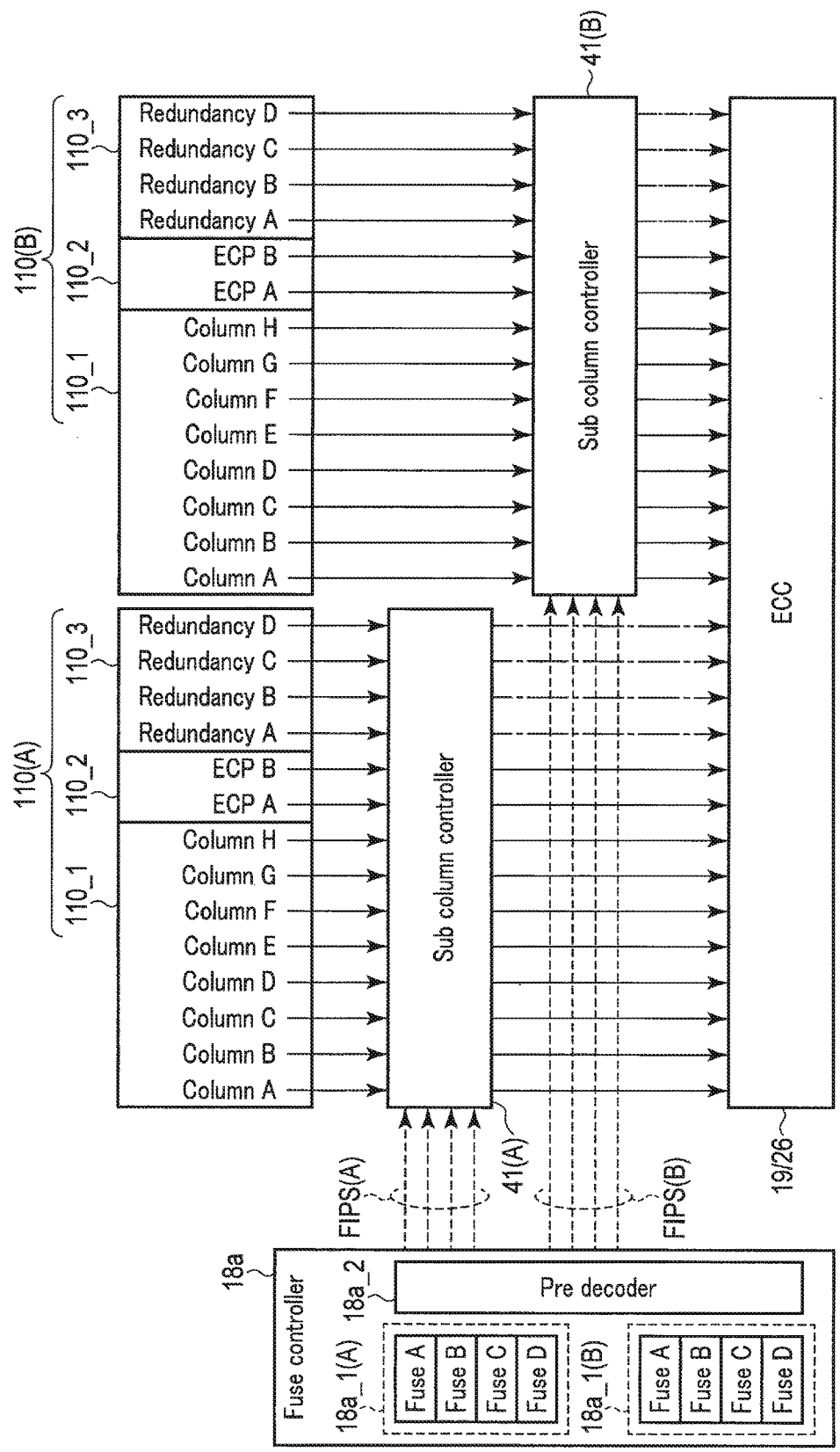
FIG. 20 is a block diagram showing a configuration of a memory array and its periphery of the memory system according to the fifth embodiment.

As shown in FIG. 20, the memory array 11 includes a plurality of sub-arrays (for example, two sub-arrays 110(A) and 110(B) in FIG. 20).

Sub-array 110(A) includes a data area 110_1, an error correcting parity area 110_2, and a redundancy area 110_3. The data area 110_1, error correcting parity area 110_2, and redundancy area 110_3 have the same basic configuration although the data stored in the area and the number of memory cells MC provided in the area are different.

The data area 110_1 includes a plurality of columns (for example, 8 columns A to H in FIG. 20). The column in the present example includes a global bit line GBL and a memory cell MC electrically connected to the global bit line GBL in the above-described embodiments, for example. The memory cells MC (not shown) included in the columns A to H store ordinary data (data other than the error correcting parity and error detecting parity).

The error correcting parity area 110_2 includes a plurality of error correcting parity columns (for example, two ECPs A and B in FIG. 20). The memory cells MC (not shown) included in the ECPs A and B store an error correcting parity.

The redundancy area 110_3 includes a plurality of redundancy columns (for example, four redundancies A to D in FIG. 20). The redundancies A to D are columns for saving, for example, unusable bad columns in the data area 110_1 and error correcting parity area 110_2. The memory cells MC (not shown) included in the redundancies A to D store, for example, ordinary data, the error correcting parity, or the error detecting parity. Information on what kind of data is stored in the redundancies A to D is stored in the fuse controller 18a.

Sub-array 110(B) has the same configuration as sub-array 110(A).

The fuse controller 18a includes fuse circuits 18a_1(A) and 18a_1(B), and a pre-decoder 18a_2.

Fuse circuit 18a_1(A) stores information on sub-array 110(A). Fuse circuit 18a_1(A) includes fuses A to D. Each fuse is, for example, a nonvolatile memory unit and stores fuse information. The fuse information is, for example, replacement information of a data area or error correcting parity area with a redundancy area, and information on which a redundancy column stores the error detecting parity.

For example, when column A or column E is a bad column (unusable), the column is replaced with redundancy A. When column B or column F is a bad column, the column is replaced with redundancy B. When column C or column G is a bad column, the column is replaced with redundancy C. In addition, when column D or column H is a bad column, the column is replaced with redundancy D. Similarly, when ECP A is a bad column, the column is replaced with redundancy A. When ECP B is a bad column, the column is replaced with redundancy B. This replacement method is an example, and the method is not limited to this. Accordingly, the fuse stores, as fuse information, information on which column or ECP is replaced with which redundancy column.

The redundancy column not used for replacement stores the error detecting parity. The fuse stores, as fuse information, information on which the redundancy column stores the error detecting parity.

Fuse circuit 18a_1(B) stores information on sub-array 110(B). The basic configuration of fuse circuit 18a_1(B) is the same as that of fuse circuit 18a_1(A).

Pre-decoder 18a_2 decodes fuse information from fuse circuit 18a_1(A) and fuse circuit 18a_1(B), and supplies the column controller 40 with fuse information pre-decode signals (indicated as "FIPS" in the drawing).

The column controller 40 includes a sub-column controller 41 for each sub-array, for example. In the present example, two sub-arrays are provided. Therefore, the column controller 40 includes two sub-column controllers 41. The sub-column controllers 41 each include a sense amplifier/write driver 12 and a column decoder 13.

Sub-column controller 41(A) controls the connection between sub-array 110(A) and the ECC circuit based on fuse information pre-decode signal (A) from pre-decoder 18a_2.

Sub-column controller 41(B) controls the connection between sub-array 110(B) and the ECC circuit based on fuse information pre-decode signal (B) from pre-decoder 18a_2.

<5-3> Operation Example of Sub-Column Controller

Next, a specific operation example of the sub-column controller will be described with reference to FIG. 21.

For example, when column D of sub-array 110(A) is a bad column, information on the replacement of column D with redundancy D is stored in fuse circuit 18a_1(A). Pre-decoder 18a_2 supplies fuse information pre-decode signal (A) based on information received from fuse circuit 18a_1 (A). Upon receipt of fuse information pre-decode signal (A), sub-column controller 41(A) replaces column D with redundancy D. Column D is thereby replaced with redundancy D (see arrow B1 in the figure). Specifically, upon receipt of fuse information pre-decode signal (A), sub-column controller 41(A) switches the connection between column D and the ECC circuit to the connection between redundancy D and the ECC circuit. Accordingly, data stored in redundancy D is handled as data stored in column D.

In contrast, when redundancy D of sub-array 110(B) is not used as a replacement for another column, redundancy D of sub-array 110(B) stores the error detecting parity. Then, information indicating that redundancy D stores the error detecting parity is stored in fuse circuit 18a_1(B). Then, pre-decoder 18a_2 supplies fuse information pre-decode signal (B) based on information received from fuse circuit 18a_1(B). Upon receipt of fuse information pre-decode signal (B), sub-column controller 41(B) outputs the error detecting parity stored in redundancy D to the ECC circuit (see arrow C1 in the figure).

<5-4> Advantage

According to the above-described embodiment, the redundancy column not used for replacement stores the error detecting parity.

To facilitate understanding of the advantage of the present embodiment, a comparative example will be described.

As shown in FIG. 22, an error detecting parity area 110_4 for storing the error detecting parity is provided in the comparative example.

In the present embodiment, however, data stored in the error detecting parity area 110_4 is stored in a redundancy column (column not used as a replacement for a data area or error correcting parity area) in the redundancy area 110_3. Therefore, as shown in FIG. 23, the error detecting parity area 110_4 can be omitted in the present embodiment. As a result, the area of the memory array 11 can be reduced in the present embodiment in comparison with the comparative example.

In addition, the fuse controller 18a performs the replacement with a redundancy area and the selection control of the redundancy column that stores the error detecting parity.

Therefore, the reduction of the area of the memory array can be realized without lowering the saving efficiency of the memory array.

<6> Sixth Embodiment

The sixth embodiment will be described. Described in the sixth embodiment is a method for using a redundancy area of a memory array. The basic configuration and basic operation of the memory device according to the sixth embodiment are the same as those of the memory device according to the above-described fifth embodiment. Thus, descriptions of matters described in the fifth embodiment and matters inferable from the fifth embodiment will be omitted.

<6-1> Configuration of Memory Array and its Periphery

The configuration of the memory array and its periphery will be described with reference to FIG. 24.

As shown in FIG. 24, the fuse controller 18a includes a fuse circuit 18a_1.

The fuse circuit 18a_1 includes fuses A to D. Each fuse stores fuse information.

In the fifth embodiment, the fuse circuit 18a_1 is provided for each sub-array, and replacement control is performed for each sub-array. In the sixth embodiment, however, one fuse circuit 18a_1 performs replacement control of a plurality of sub-arrays.

In the memory system according to the present embodiment, redundancy replacement is performed in n-column blocks (n is an integer not less than two). In the memory system according to the present embodiment, redundancy replacement is performed in, for example, two-column blocks.

Specifically, the memory system performs the same replacement control on two different memory arrays. Namely, when column X (X: a given integer) of sub-array 110(A) or sub-array 110(B) is a bad column, the memory system replaces column X of sub-array 110(A) and column X of sub-array 110(B) with redundancies Y (Y: an integer) of sub-array 110(A) and sub-array 110(B).

Specifically, for example, when column A or column E of sub-array 110(A) is a bad column, columns A or columns E of sub-array 110(A) and sub-array 110(B) are replaced with redundancies A of sub-array 110(A) and sub-array 110(B).

When column A or column E of sub-array 110(B) is a bad column, columns A or columns E of sub-array 110(A) and sub-array 110(B) are replaced with redundancies A of sub-array 110(A) and sub-array 110(B).

When column B or column F of sub-array 110(A) is a bad column, columns B or columns F of sub-array 110(A) and sub-array 110(B) are replaced with redundancies B of sub-array 110(A) and sub-array 110(B).

When column B or column F of sub-array 110(B) is a bad column, columns B or columns F of sub-array 110(A) and sub-array 110(B) are replaced with redundancies B of sub-array 110(A) and sub-array 110(B).

When column C or column G of sub-array 110(A) is a bad column (unusable), columns C or columns G of sub-array 110(A) and sub-array 110(B) are replaced with redundancies C of sub-array 110(A) and sub-array 110(B).

When column C or column G of sub-array 110(B) is a bad column (unusable), columns C or columns G of sub-array 110(A) and sub-array 110(B) are replaced with redundancies C of sub-array 110(A) and sub-array 110(B).

When column D or column H of sub-array 110(A) is a bad column (unusable), columns D or columns H of sub-array 110(A) and sub-array 110(B) are replaced with redundancies D of sub-array 110(A) and sub-array 110(B).

When column D or column H of sub-array 110(B) is a bad column (unusable), columns D or columns H of sub-array 110(A) and sub-array 110(B) are replaced with redundancies D of sub-array 110(A) and sub-array 110(B).

When ECP A of sub-array 110(A) or sub-array 110(B) is a bad column, ECPs A of sub-array 110(A) and sub-array 110(B) are replaced with redundancies A of sub-array 110 (A) and sub-array 110(B).

When ECP B of sub-array 110(A) or sub-array 110(B) is a bad column, ECPs B of sub-array 110(A) and sub-array 110(B) are replaced with redundancies B of sub-array 110 (A) and sub-array 110(B).

This replacement method is an example, and the method is not limited to this. Accordingly, the fuse stores, as fuse information, information on which column or ECP is replaced with which redundancy column.

In addition, the fuse stores, as fuse information, information on which redundancy column stores an error detecting parity.

As described above, replacement is performed in two-column blocks in the present embodiment. Namely, when at least one column of two columns is a bad column, the bad column is replaced with a redundancy column. However, there is a case where one of two columns is a bad column, and the other is a good column. In this case, the good column need not be replaced with a redundancy column. By refraining from replacing the good column with a redundancy column, the space of a redundancy column can be free. Accordingly, the memory system according to the present embodiment stores the error detecting parity in the free space of the redundancy column. The fuse circuit 18a_1 stores information for storing the error detecting parity in the free space of the redundancy column.

The pre-decoder 18a_2 decodes a signal from the fuse circuit 18a_1, and supplies the sub-column controllers 41 with a fuse information pre-decode signal and parity indication signals (A) and (B) (indicated as "PAS" in the figure). The fuse information pre-decode signal includes replacement information. The parity indication signals (A) and (B) are signals indicating whether the redundancy area includes an error detecting parity. The fuse information pre-decode signal is commonly supplied to a plurality of sub-column controllers 41. The parity indication signal is supplied for each of the sub-column controllers 41.

Sub-column controller 41(A) controls the connection between sub-array 110(A) and the ECC circuit based on the fuse information pre-decode signal and parity indication signal (A) from the pre-decoder 18a_2.

Regarding the "column included in the fuse information pre-decode signal but not indicated by parity indication signal (A)", sub-column controller 41(A) outputs, as data of a bad column, data of the replacement redundancy column on the basis of the fuse information pre-decode signal and parity indication signal (A). Regarding the "column included in the fuse information pre-decode signal and indicated by parity indication signal (A)", sub-column controller 41(A) outputs the data of the column, and outputs data of the redundancy column as the error detecting parity.

Sub-column controller 41(B) controls the connection between sub-array 110(B) and the ECC circuit based on the fuse information pre-decode signal and parity indication signal (B) from the pre-decoder 18a_2.

Regarding the "column included in the fuse information pre-decode signal but not indicated by parity indication signal (B)", sub-column controller 41(B) outputs, as data of a bad column, data of the replacement redundancy column on the basis of the fuse information pre-decode signal and parity indication signal (B). Regarding the "column included in the fuse information pre-decode signal and indicated by parity indication signal (B)", sub-column controller 41(B) outputs the data of the column, and outputs data of the redundancy column as the error detecting parity.

<6-2> Operation Example of Sub-Column Controller

Next, a specific operation example of the sub-column controller will be described with reference to FIG. 25.

For example, when column D of sub-array 110(A) is a bad column, information on replacement of columns D of sub-array 110(A) and sub-array 110(B) with redundancies D is stored in the fuse circuit 18a_1.

When column D of sub-array 110(B) is a good column, information indicating that column D of sub-array 110(B) is a good column, and that the error detecting parity is stored in redundancy D of sub-array 110(B), is stored in the fuse circuit 18a_1.

The pre-decoder 18a_2 supplies a fuse information pre-decode signal, parity indication signal (A), and parity indication signal (B) based on information received from the fuse circuit 18a_1.

Upon receipt of the fuse information pre-decode signal and parity indication signal (A), sub-column controller 41(A) replaces column D of sub-array 110(A) with redundancy D of sub-array 110(A). Column D is thereby replaced with redundancy D (see arrow B2 in the figure). Specifically, when sub-column controller 41(A) receives a fuse information pre-decode signal and parity indication signal (A), and determines that "column D is indicated by the fuse information pre-decode signal but is not indicated by parity indication signal (A)", sub-column controller 41(A) switches the connection between column D and the ECC circuit to the connection between redundancy D and the ECC circuit. Accordingly, data stored in redundancy D is handled as data stored in column D.

Upon receipt of the fuse information pre-decode signal and parity indication signal (B), sub-column controller 41(B) outputs data stored in column D of sub-array 110(B) to the ECC circuit, and outputs the error detecting parity stored in redundancy D of sub-array 110(B) to the ECC circuit (see arrow C2 in the figure). Specifically, when sub-column controller 41(B) receives a fuse information pre-decode signal and parity indication signal (B), and determines that "column D is indicated by the fuse information pre-decode signal and is indicated by parity indication signal (B)", sub-column controller 41(B) connects column D to the ECC circuit, and connects redundancy D to the ECC circuit. Accordingly, data stored in column D is output, and data stored in redundancy D is handled as an error detecting parity.

<6-3> Advantage

According to the above-described embodiment, the redundancy column not used for replacement stores the error detecting parity.

In addition, the fuse control circuit 18a_1 is provided for each memory array in the fifth embodiment, whereas one fuse circuit 18a_1 manages replacement information of all memory arrays in the present embodiment. Therefore, the area required for the fuse circuit 18a_1 is smaller than in the fifth embodiment. Moreover, the use of the parity indication signal controls the appropriate use of good columns. As a result, a memory device that can appropriately save a bad column can be provided while reducing the area of the fuse circuit 18a_1.

<7> Modifications Etc.

The terms "connect" and "couple" in the above-described embodiments include the states of an indirect connection, or coupling via a transistor, a resistor, or the like.

In the above-described embodiments, the sense amplifier/write driver 12 determines data of the memory cell MC by comparing a cell current with a reference current. However, the embodiments are not limited to this, and the sense amplifier/write driver 12 may determine data of the memory cell MC by comparing a cell voltage with a reference voltage. The cell voltage is a voltage of the time when a read current is applied to the memory cell MC.

In the above-described first and second embodiments, the memory controller 20 does not include an ECC circuit, but including an ECC circuit is also acceptable. In the above-described third and fourth embodiments, the memory device 10 does not include an ECC circuit, but including an ECC circuit is also acceptable.

Herein, an MRAM for storing data using a magnetoresistive effect element (a magnetic tunnel junction (MTJ)

element) as a variable resistor element is explained as an example; however, the memory device is not limited thereto.

For example, the embodiments may be applicable to a resistance change type memory similar to the MRAM, for example, a semiconductor memory device including an element that stores data using a resistance change, such as ReRAM or PCRAM.

In addition, the embodiments may be applicable to a semiconductor memory device including an element that can store data by a resistance change caused by application of a current or voltage, or read data stored by converting the resistance difference caused by the resistance change into a current difference or a voltage difference, regardless of whether the semiconductor memory device is a volatile memory or a nonvolatile memory.

In each of the above embodiments, the bit line pair is referred to as a bit line BL and a source line SL for descriptive purposes. However, the bit line pair may be referred to as a first bit line and a second bit line, for example.

In the embodiment described above, the memory system 1 has a configuration in which one memory device 10 is connected to the memory controller 20. However, the configuration is not limited to this. For example, the memory system 1 may have a configuration in which a plurality of memory devices 10 are connected to the memory controller 20.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
a memory cell which stores first data therein; and
a first circuit that, when the memory device receives a first command:
performs a first read on the memory cell to read the first data,
performs a first write to write second data to the memory cell after the first read, the second data being reference data that is different from the first data,
performs a second read on the memory cell after the first write,
determines the first data based on a result of the first read and the second read,
performs a second write to write the determined data into the memory cell, and simultaneously supplies the determined data to an error correcting circuit, and
performs a third write to write error-corrected data generated by the error correcting circuit into the memory cell only if the error correcting circuit detects an error in the determined data.

2. The memory device of claim 1, wherein:
when the memory device receives a second command and the determined data is different from the error-corrected data, the first circuit writes the error-corrected data into the memory cell.

3. The memory device of claim 1, wherein:
based on the result of the second read, the first circuit generates a first current for evaluating the first data.

4. The memory device of claim 3, wherein:
the first circuit evaluates the first data by comparing the result of the first read with the first current.

5. The memory device of claim 4, wherein:
the first circuit generates the first current based on the result of the second read and an offset current which is stored in a memory.

6. The memory device of claim 1, wherein:
based on the result of the second read, the first circuit generates a first voltage for evaluating the first data.

7. The memory device of claim 6, wherein:
the first circuit evaluates the first data by comparing the result of the first read with the first voltage.

8. The memory device of claim 1, further comprising the error correcting circuit.

9. A memory system comprising:
a memory cell which stores first data therein;
an error correcting circuit that performs error correction on determined data; and
a first circuit that, when receiving a first command:
performs a first read on the memory cell to read the first data,
performs a first write to write second data to the memory cell after the first read has been performed, the second data being reference data that is different from the first data,
performs a second read on the memory cell after the first write,
determines the first data based on a result of the first read and the second read,
performs a second write to write the determined data into the memory cell, and simultaneously supplies the determined data to the error correcting circuit, and
performs a third write to write error-corrected data generated by the error correcting circuit into the memory cell only if the error correcting circuit detects an error in the determined data.

10. The memory system of claim 9, further comprising:
a memory device including the memory cell and the first circuit; and
a memory controller including the error correcting circuit.

11. The memory system of claim 10, wherein:
when the memory device receives a second command from the memory controller and the determined data is different from the error-corrected data, the first circuit writes the error-corrected data into the memory cell.

12. The memory system of claim 9, wherein:
based on the result of the second read, the first circuit generates a first current for evaluating the first data.

13. The memory system of claim 12, wherein:
the first circuit evaluates the first data by comparing the result of the first read with the first current.

14. The memory system of claim 13, wherein:
the first circuit generates the first current based on the result of the second read and an offset current which is stored in a memory.

15. The memory system of claim 9, wherein:
based on the result of the second read, the first circuit generates a first voltage for evaluating the first data.

16. The memory system of claim 15, wherein:
the first circuit evaluates the first data by comparing the result of the first read with the first voltage.

* * * * *